(12) United States Patent
Keeth

(10) Patent No.: US 12,045,500 B2
(45) Date of Patent: *Jul. 23, 2024

(54) MEMORY DEVICE INTERFACE AND METHOD

(71) Applicant: Micron Technology, Inc., Boise, ID (US)

(72) Inventor: Brent Keeth, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/138,527

(22) Filed: Apr. 24, 2023

(65) Prior Publication Data

US 2023/0376235 A1    Nov. 23, 2023

Related U.S. Application Data

(63) Continuation of application No. 17/136,728, filed on Dec. 29, 2020, now Pat. No. 11,635,910.
(Continued)

(51) Int. Cl.
   *G06F 3/06*    (2006.01)
   *G11C 5/04*    (2006.01)
   *G11C 7/10*    (2006.01)

(52) U.S. Cl.
   CPC .......... *G06F 3/0655* (2013.01); *G06F 3/0604* (2013.01); *G06F 3/0679* (2013.01); *G11C 5/04* (2013.01); *G11C 7/1006* (2013.01)

(58) Field of Classification Search
   CPC .... G06F 3/0655; G06F 3/0604; G06F 3/0679; G06F 11/1048; G11C 5/04;
   (Continued)

(56) References Cited

U.S. PATENT DOCUMENTS 6,226,738 B1    5/2001   Dowling
6,460,152 B1    10/2002  Demidov et al.
(Continued)

FOREIGN PATENT DOCUMENTS

CN    104471649 B    6/2017
CN    113728383 A    11/2021
(Continued)

OTHER PUBLICATIONS

"Chinese Application Serial No. , Voluntary Amendment filed Mar. 21, 2022", with English claims, 16 pages.
(Continued)

*Primary Examiner* — Fernando Hidalgo
(74) *Attorney, Agent, or Firm* — Schwegman Lundberg & Woessner, P.A.

(57) ABSTRACT

Apparatus and methods are disclosed, including memory devices and systems. In an example, a memory module can include a first stack of at least eight memory die including four pairs of memory die, each pair of the four pairs of memory die associated with an individual memory rank of four memory ranks of the memory module, a memory controller configured to receive memory access commands and to access memory locations of the first stack, and a substrate configured to route connections between external terminations of the memory module and the memory controller.

20 Claims, 16 Drawing Sheets

Related U.S. Application Data

(60) Provisional application No. 62/954,954, filed on Dec. 30, 2019.

(58) Field of Classification Search
CPC .......... G11C 7/1006; G11C 2029/1206; G11C 5/063; G11C 29/1201; G11C 5/025
USPC .......................................................... 365/63
See application file for complete search history.

(56) References Cited

U.S. PATENT DOCUMENTS

| | | | |
|---|---|---|---|
| 7,640,386 B2 | 12/2009 | Coteus et al. | |
| 7,717,752 B2 | 5/2010 | Loughner et al. | |
| 8,069,379 B2 | 11/2011 | Perego et al. | |
| 8,275,936 B1 | 9/2012 | Haywood et al. | |
| 8,543,758 B2 | 9/2013 | Larson et al. | |
| 8,754,533 B2 | 6/2014 | Or-bach et al. | |
| 8,984,189 B2 | 3/2015 | Casper et al. | |
| 9,357,649 B2 | 5/2016 | Chun et al. | |
| 9,378,707 B2 | 6/2016 | Lee | |
| 9,391,048 B2 | 7/2016 | Lee | |
| 9,489,009 B2 | 11/2016 | Lee et al. | |
| 9,519,315 B2 | 12/2016 | Connolly | |
| 9,558,805 B2 | 1/2017 | Kang et al. | |
| 10,528,267 B2 | 1/2020 | Batra et al. | |
| 10,621,043 B2 | 4/2020 | Casper et al. | |
| 10,628,295 B2 | 4/2020 | Gu et al. | |
| 10,649,680 B2 | 5/2020 | Riley et al. | |
| 10,733,500 B2 | 8/2020 | Andreopoulos et al. | |
| 10,740,033 B2 | 8/2020 | Kim et al. | |
| 10,797,020 B2 | 10/2020 | Thurgood | |
| 10,877,857 B2 | 12/2020 | Park | |
| 10,922,607 B2 | 2/2021 | Sengupta et al. | |
| 11,386,004 B2 | 7/2022 | Keeth et al. | |
| 11,538,508 B2 | 12/2022 | Gibbons et al. | |
| 11,635,910 B2 * | 4/2023 | Keeth .................... | G11C 5/063 365/63 |
| 2004/0163028 A1 | 8/2004 | Olarig | |
| 2004/0233721 A1 | 11/2004 | Kim et al. | |
| 2004/0260957 A1 | 12/2004 | Jeddeloh et al. | |
| 2006/0107186 A1 | 5/2006 | Cowell et al. | |
| 2006/0126369 A1 | 6/2006 | Raghuram | |
| 2006/0233012 A1 | 10/2006 | Sekiguchi et al. | |
| 2008/0080261 A1 | 4/2008 | Shaeffer et al. | |
| 2008/0109597 A1 | 5/2008 | Schakel et al. | |
| 2008/0123459 A1 | 5/2008 | Rajan et al. | |
| 2008/0126690 A1 * | 5/2008 | Rajan .................. | G06F 13/1673 711/E12.001 |
| 2008/0136002 A1 | 6/2008 | Yang | |
| 2008/0253199 A1 | 10/2008 | Torabi et al. | |
| 2009/0021874 A1 | 1/2009 | Divito et al. | |
| 2009/0103345 A1 | 4/2009 | Mclaren et al. | |
| 2009/0248969 A1 | 10/2009 | Wu et al. | |
| 2010/0091537 A1 | 4/2010 | Best et al. | |
| 2010/0195363 A1 | 8/2010 | Norman | |
| 2010/0309706 A1 | 12/2010 | Saito et al. | |
| 2012/0051152 A1 | 3/2012 | Hollis | |
| 2012/0069034 A1 | 3/2012 | Biswas et al. | |
| 2012/0102292 A1 | 4/2012 | Rajan et al. | |
| 2012/0284436 A1 | 11/2012 | Casper et al. | |
| 2012/0311231 A1 | 12/2012 | Porterfield | |
| 2014/0063887 A1 | 3/2014 | Vogelsang | |
| 2014/0173238 A1 | 6/2014 | Perego et al. | |
| 2014/0192583 A1 * | 7/2014 | Rajan ....................... | G11C 7/10 365/63 |
| 2014/0252656 A1 | 9/2014 | Lee | |
| 2014/0254245 A1 | 9/2014 | Tadepalli et al. | |
| 2014/0358834 A1 | 12/2014 | Kim et al. | |
| 2015/0155876 A1 | 6/2015 | Jayasena et al. | |
| 2015/0355965 A1 | 12/2015 | Peddle | |
| 2016/0284424 A1 | 9/2016 | Das et al. | |
| 2016/0329303 A1 | 11/2016 | Ye et al. | |
| 2017/0147432 A1 | 5/2017 | Suh et al. | |
| 2017/0194962 A1 | 7/2017 | Bains et al. | |
| 2017/0255552 A1 | 9/2017 | Chatterjee et al. | |
| 2017/0323875 A1 | 11/2017 | Tam | |
| 2017/0344051 A1 | 11/2017 | Patel | |
| 2018/0068217 A1 | 3/2018 | Eleftheriou et al. | |
| 2018/0102344 A1 | 4/2018 | Ramachandra et al. | |
| 2018/0174996 A1 | 6/2018 | Mostovoy et al. | |
| 2018/0225235 A1 | 8/2018 | Lee | |
| 2018/0309451 A1 | 10/2018 | Lu et al. | |
| 2019/0146788 A1 | 5/2019 | Kim | |
| 2019/0171359 A1 | 6/2019 | Lee et al. | |
| 2019/0171520 A1 | 6/2019 | Cadigan et al. | |
| 2019/0318230 A1 | 10/2019 | Cho et al. | |
| 2020/0143229 A1 | 5/2020 | Van Der Made et al. | |
| 2020/0151550 A1 | 5/2020 | Garbin et al. | |
| 2020/0235050 A1 | 7/2020 | Lee et al. | |
| 2020/0250516 A1 | 8/2020 | Li et al. | |
| 2020/0272560 A1 | 8/2020 | Keeth et al. | |
| 2020/0272564 A1 | 8/2020 | Keeth et al. | |
| 2020/0279588 A1 | 9/2020 | Lym et al. | |
| 2021/0073616 A1 | 3/2021 | Moraitis et al. | |
| 2021/0125045 A1 | 4/2021 | Jang et al. | |
| 2021/0132856 A1 | 5/2021 | Chen | |
| 2021/0181974 A1 | 6/2021 | Ghosh | |
| 2021/0200464 A1 | 7/2021 | Keeth | |
| 2021/0200699 A1 | 7/2021 | Keeth et al. | |
| 2021/0201966 A1 | 7/2021 | Gibbons et al. | |
| 2021/0318956 A1 | 10/2021 | Keeth et al. | |
| 2021/0406660 A1 | 12/2021 | Chen | |
| 2022/0121393 A1 | 4/2022 | Keeth | |
| 2022/0342814 A1 | 10/2022 | Keeth et al. | |

FOREIGN PATENT DOCUMENTS

| | | |
|---|---|---|
| CN | 113767435 A | 12/2021 |
| CN | 114902332 A | 8/2022 |
| CN | 114930452 A | 8/2022 |
| DE | 102019134293 A1 | 7/2020 |
| JP | 2016522495 A | 7/2016 |
| KR | 100988388 B1 | 10/2010 |
| KR | 20160143988 A | 12/2016 |
| KR | 20170029074 A | 3/2017 |
| WO | WO-2020172551 A1 | 8/2020 |
| WO | WO-2020172557 A1 | 8/2020 |
| WO | WO-2021133826 A1 | 7/2021 |
| WO | WO-2021138329 A1 | 7/2021 |
| WO | WO-2021138408 A1 | 7/2021 |
| WO | WO-2022087142 A1 | 4/2022 |

OTHER PUBLICATIONS

"Chinese Application Serial No. 202080030315.4, Voluntary Amendment filed Mar. 25, 2022", with English claims, 14 pages.

"European Application Serial No. 20758657.9, Extended European Search Report mailed Sep. 22, 2022", 8 pgs.

"European Application Serial No. 20758657.9, Response Filed Apr. 11, 2022 to Communication Pursuant to Rules 161(2) and 162 EPC mailed Oct. 1, 2021", 9 pgs.

"European Application Serial No. 20759297.3, Extended European Search Report mailed Nov. 2, 2022", 9 pgs.

"European Application Serial No. 20759297.3, Response Filed Apr. 19, 2022 to Communication Pursuant to Rules 161(2) and 162 EPC mailed Oct. 5, 2021", 9 pgs.

"International Application Serial No. PCT/US2020/019259, International Preliminary Report on Patentability mailed Sep. 2, 2021", 8 pgs.

"International Application Serial No. PCT/US2020/019259, International Search Report mailed Jun. 19, 2020", 6 pgs.

"International Application Serial No. PCT/US2020/019259, Written Opinion mailed Jun. 19, 2020", 6 pgs.

"International Application Serial No. PCT/US2020/019269, International Preliminary Report on Patentability mailed Sep. 2, 2021", 9 pgs.

"International Application Serial No. PCT/US2020/019269, International Search Report mailed Jun. 18, 2020", 4 pgs.

"International Application Serial No. PCT/US2020/019269, Written Opinion mailed Jun. 18, 2020", 7 pgs.

(56) References Cited

OTHER PUBLICATIONS

"International Application Serial No. PCT/US2020/066664, International Preliminary Report on Patentability mailed Jul. 7, 2022", 5 pgs.
"International Application Serial No. PCT/US2020/066664, International Search Report mailed Apr. 8, 2021", 4 pgs.
"International Application Serial No. PCT/US2020/066664, Written Opinion mailed Apr. 8, 2021", 3 pgs.
"International Application Serial No. PCT/US2020/067319, International Preliminary Report on Patentability mailed Jul. 14, 2022", 6 pgs.
"International Application Serial No. PCT/US2020/067319, International Search Report mailed Apr. 19, 2021", 4 pgs.
"International Application Serial No. PCT/US2020/067319, Written Opinion mailed Apr. 19, 2021", 4 pgs.
"International Application Serial No. PCT/US2020/067447, International Preliminary Report on Patentability mailed Jul. 14, 2022", 6 pgs.
"International Application Serial No. PCT/US2020/067447, International Search Report mailed Apr. 27, 2021", 3 pgs.
"International Application Serial No. PCT/US2020/067447, Written Opinion mailed Apr. 7, 2021", 4 pgs.
"International Application Serial No. PCT/US2021/055866, International Search Report mailed Feb. 4, 2022", 4 pgs.
"International Application Serial No. PCT/US2021/055866, Written Opinion mailed Feb. 4, 2022", 4 pgs.
"Chinese Application Serial No. 202080030311.6, Response filed Jan. 5, 2023 to Office Action mailed Aug. 26, 2022", with English claims, 13 pages.
"European Application Serial No. 20905242.2, Extended European Search Report mailed Mar. 3, 2023", 10 pgs.
"European Application Serial No. 20909806.0, Extended European Search Report mailed May 4, 2023", 12 pgs.
"European Application Serial No. 20909806.0, Partial Supplementary European Search Report mailed Jan. 10, 2023", 12 pgs.
"European Application Serial No. 20911114.5, Extended European Search Report mailed Jan. 18, 2024", 9 pgs.
"International Application Serial No. PCT/US2021/055866, International Preliminary Report on Patentability mailed May 4, 2023", 6 pgs.
"Korean Application Serial No. 10-2021-7030514, Notice of Preliminary Rejection mailed Nov. 10, 2023", with English translation, 15 pages.
"Korean Application Serial No. 10-2021-7030514, Response filed Feb. 13, 2024 to Notice of Preliminary Rejection mailed Nov. 10, 2023", with English claims, 22 pages.
"The Authoritative Dictionary of IEEE Standards Terms", 7th ed. IEEE, Standards Information Network IEEE Press, [Online] Retrieved from the internet: <https://ieeexplore.ieee.org/stamp/stamp.jsp?arnumber=4116787>, (2000), 5 pgs.
Madany, Waleed, et al., "An Enhanced PAM With PPM Modulation Interface For Memory Applications", 4 pgs.

\* cited by examiner

MEMORY DEVICE INTERFACE AND METHOD

PRIORITY AND RELATED APPLICATIONS

This application is a continuation of U.S. application Ser. No. 17/136,728, filed Dec. 29, 2020, which claims the benefit of priority to Keeth, U.S. Provisional Patent Application Ser. No. 62/954,954, titled, MEMORY DEVICE INTERFACE AND METHOD, filed on Dec. 30, 2019, all of which are hereby incorporated by reference herein in their entirety.

TECHNICAL FIELD

The present description addresses relates generally memory modules; and more particularly, to the modular modules providing various levels of error correction.

BACKGROUND

Memory devices are semiconductor circuits that provide electronic storage of data for a host system (e.g., a computer or other electronic device). Memory devices may be volatile or non-volatile. Volatile memory requires power to maintain data, and includes devices such as random-access memory (RAM), static random-access memory (SRAM), dynamic random-access memory (DRAM), or synchronous dynamic random-access memory (SDRAM), among others. Non-volatile memory can retain stored data when not powered, and includes devices such as flash memory, read-only memory (ROM), electrically erasable programmable ROM (EEPROM), erasable programmable ROM (EPROM), resistance variable memory, such as phase change random access memory (PCRAM), resistive random-access memory (RRAM), or magnetoresistive random access memory (MRAM), among others.

Host systems typically include a host processor, a first amount of main memory (e.g., often volatile memory, such as DRAM) to support the host processor, and one or more storage systems (e.g., often non-volatile memory, such as flash memory) that provide additional storage to retain data in addition to or separate from the main memory.

A storage system, such as a solid-state drive (SSD), can include a memory controller and one or more memory devices, including a number of dies or logical units (LUNs). In certain examples, each die can include a number of memory arrays and peripheral circuitry thereon, such as die logic or a die processor. The memory controller can include interface circuitry configured to communicate with a host device (e.g., the host processor or interface circuitry) through a communication interface (e.g., a bidirectional parallel or serial communication interface). The memory controller can receive commands or operations from the host system in association with memory operations or instructions, such as read or write operations to transfer data (e.g., user data and associated integrity data, such as error data or address data, etc.) between the memory devices and the host device, erase operations to erase data from the memory devices, perform drive management operations (e.g., data migration, garbage collection, block retirement), etc.

Applications for memory modules vary. Error correction is a capability that may or may not be important to the application but can often require very different modules depending on the need to have error correction implemented within the memory module and to what degree the memory module is to provide error correction. Each variation with regard to error correction can often require a completely different memory module architecture.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

Described below is an example memory module architecture incorporating a base memory module configuration. In examples described below, more sophisticated error correction functionality can be provided by combining the base architecture with additional memory devices. For example, a memory module based on just the base architecture can be idea for a system that does not use memory error correction or does not need memory space of the memory module for error correction functionality. In some examples, one or more additional memory devices can be stacked with the base architecture to provide storage space for information associated with error correction code (ECC) functionality. In further examples, a second one or more additional memory devices can be further stacked to provide storage space of information associated with for Single Device Data Correction (SDDC) (trademark of Intel) functionality.

Figure 1A:
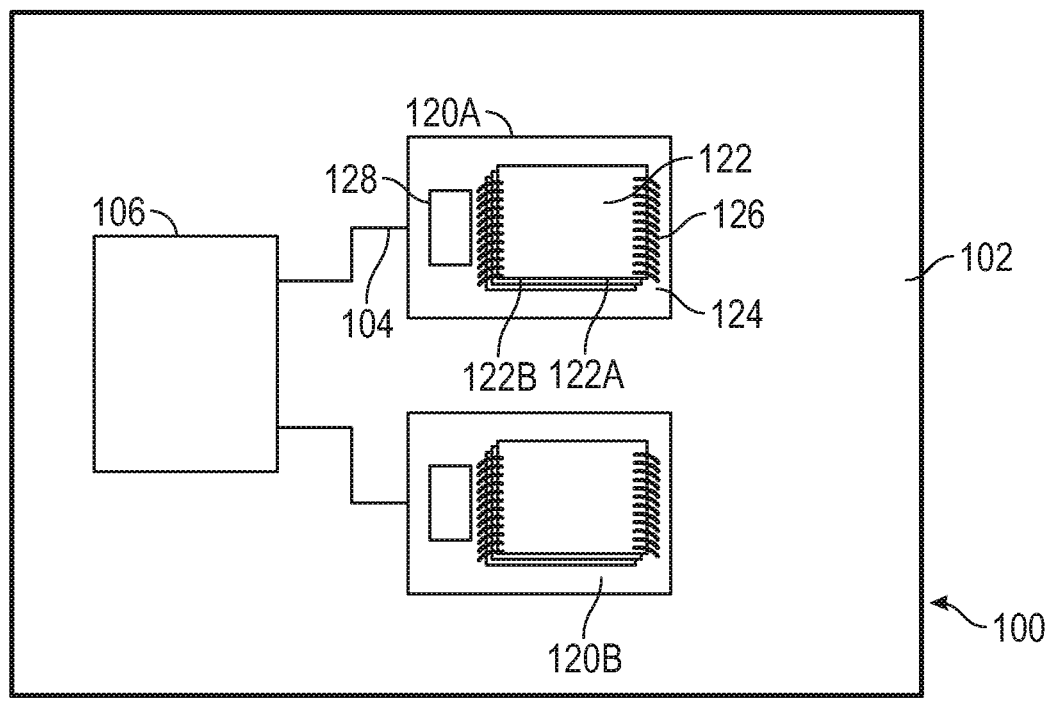
FIGS. 1A and 1B illustrate generally an example electronic system.

FIG. 1A shows an electronic system 100, having a processor 106 coupled to a substrate 102. In some examples substrate 102 can be a system motherboard, or in other examples, substrate 102 may couple to another substrate, such as a motherboard. Electronic system, 100 also includes first and second memory devices 120A, 120B. Memory devices 120A, 120B are also shown supported by substrate 102 adjacent to the processor 106 but are depicted, in an example configuration, coupled to a secondary substrate 124. In other examples, memory devices 120A, 120B can be coupled directly to the same substrate 102 as processor 106.

The memory devices 120A, 120B, each include a buffer assembly, here in the example form of a buffer die 128, coupled to a secondary substrate 124. The memory devices 120A, 120B can be individual die, or in some cases may each include a respective stack of memory devices 122. For purposes of the present description, memory devices 120A, 120B will be described in an example configuration of stacked memory devices. Additionally, memory devices 120A, 120B will be described in one example configuration in which the devices are dynamic random access memory (DRAM) dies 122A, 122B are each coupled to the secondary substrate 124. Other types of memory devices may be used in place of DRAM, including, for example FeRAM, phase change memory (PCM), 3D XPoint™ memory, NAND memory, or NOR memory, or a combination thereof. In some cases, a single memory device may include one or more memory die that uses a first memory technology (e.g., DRAM) and a second memory die that uses a second memory technology (e.g., SRAM, FeRAM, etc.) different from the first memory technology.

The stack of DRAM dies 122 are shown in block diagram form in FIG. 1. In the example of FIG. 1A, a number of wire bonds 126 are shown coupled to the stack of DRAM dies 122. Additional circuitry (not shown) is included on or within the substrate 124. The additional circuitry completes the connection between the stack of DRAM dies 122, through the wire bonds 126, to the buffer die 120. Selected examples may include through silicon vias (TSVs) instead of wire bonds 126 as will be described in more detail in subsequent figures.

Figure 1B:
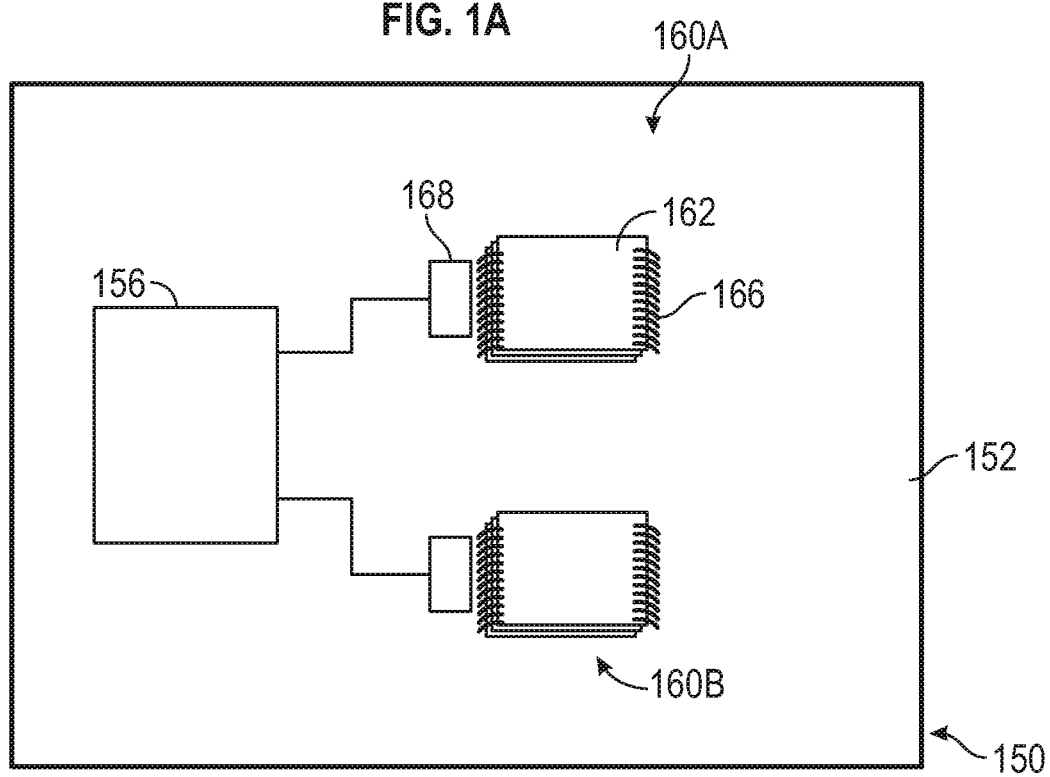

Substrate wiring 104 is shown coupling the memory device 120A to the processor 106. In the example of FIG. 1B, an additional memory device 120B is shown. Although two memory devices 120A, 120B are shown for the depicted example, a, single memory structure may be used, or a number of memory devices greater than two may be used. Examples of memory devices as described in the present disclosure provide increased capacity near memory with increased speed and reduced manufacturing cost.

FIG. 1B shows an electronic system 150, having a processor 156 coupled to a substrate 152. The system 150 also includes first and second memory devices 160A, 160B. In contrast to FIG. 1A, in FIG. 1B, the first and second memory devices 160A, 160B are directly connected to the same substrate 102 as the processor 156, without any intermediary substrates or interposers. This configuration can provide additional speed and reduction in components over the example of FIG. 1A. Similar to the example of FIG. 1A, a buffer assembly or buffer die 168 is shown adjacent to a stack of DRAM dies 162. Wire bonds 166 are shown as an example interconnection structure, however other interconnection structures such as TSVs may be used.

Figure 2:
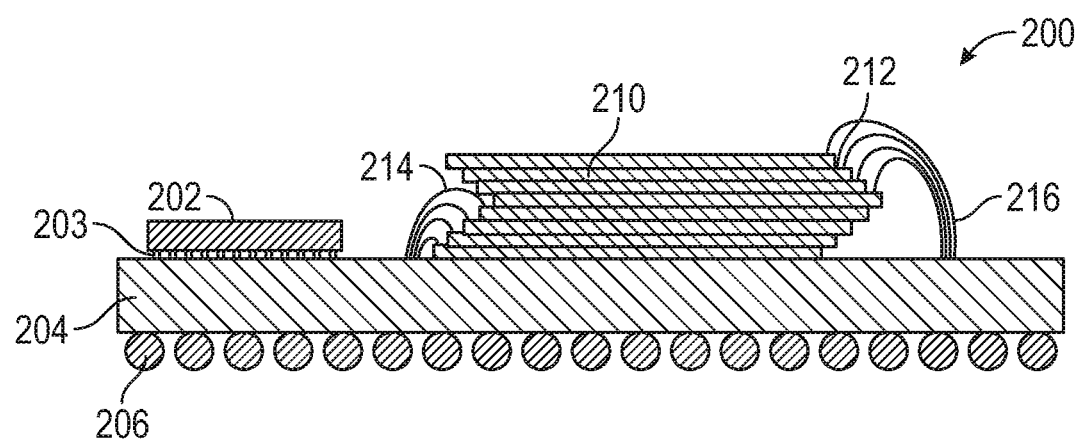
FIG. 2 illustrates generally an example memory system.

FIG. 2 shows a memory system 200 similar to memory device 118A or 118B from FIG. 1B. The memory device 200 includes a buffer die 202 coupled to a substrate 204. The memory device 200 also includes a stack of DRAM dies 210 coupled to the substrate 204. In the example of FIG. 2, the individual dies in the stack of DRAM dies 210 are laterally offset from one or more vertically adjacent die specifically, in the depicted example, each die is laterally offset from both vertically adjacent die. As an example, the die may be staggered in at least one stair step configuration. The Example of FIG. 2 shows two different stagger directions in the stair stepped stack of DRAM dies 210. In the illustrated dual stair step configuration, an exposed surface portion 212 of each die is used for a number of wire bond interconnections.

Multiple wire bond interconnections 214, 216 are shown from the dies in the stack of DRAM dies 210 to the substrate 204. Additional conductors (not shown) on or within the substrate 204 further couple the wire bond interconnections 214, 216 to the buffer die 202. The buffer die 202 is shown coupled to the substrate 204 using one or more solder interconnections 203, such as a solder ball array. A number of substrate solder interconnections 206 are further shown on a bottom side of the substrate 204 to further transmit signals and data from the buffer die into a substrate 102 and eventually to a processor 106 as shown in FIG. 1B.

Figure 3:
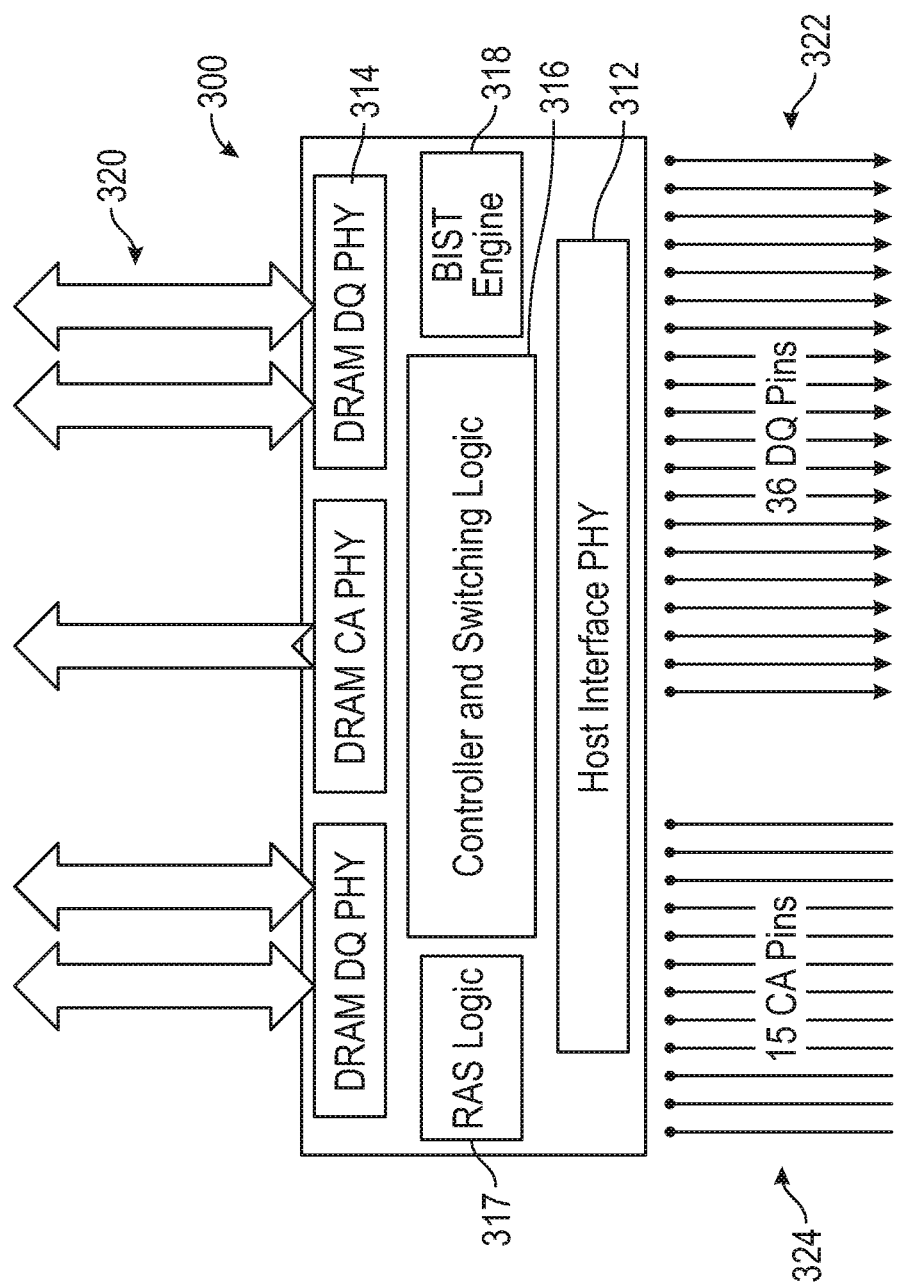
FIG. 3 illustrates generally a block diagram of a buffer die of an example memory system.

FIG. 3 shows a block diagram of a buffer die 300 similar to buffer die 202 from FIG. 2. A host device interface 312 and a DRAM interface 314 are shown. Additional circuitry components of the buffer die 300 may include a controller and switching logic 316; reliability, availability, and serviceability (RAS) logic 317; and built-in self-test (BIST) logic 318. Communication from the buffer die 300 to a stack of DRAM dies is indicated by arrows 320. Communication from the buffer die 300 to a host device is indicated by arrows 322 and 324. In FIG. 3, arrows 322 denote communication from command/address (CA) pins, and arrows 324 denote communication from data (DQ) pins 322. Example numbers of CA pins and DQ pins are provided only as examples, as the host device interface may have substantially greater or fewer of either or both CA and DQ pins. The number of pins of either type required may vary depending upon the width of the channel of the interface, the provision for additional bits (for example ECC bits), among many other variables. In many examples, the host device interface will be an industry standard memory interface (either expressly defined by a standard-setting organization, or a de facto standard adopted in the industry).

In one example, all CA pins 324 act as a single channel, and all data pins 322 act as a single channel. In one example, all CA pins service all data pins 322. In another example, the CA pins 324 are subdivided into multiple sub-channels. In another example, the data pins 322 are subdivided into multiple sub-channels. One configuration may include a portion of the CA pins 324 servicing a portion of the data pins 322. In one specific example, 8 CA pins service 9 data (DQ) pins as a sub-combination of CA pins and data (DQ) pins. Multiple sub-combinations such as the 8 CA pin/9 data pin example, may be included in one memory device.

It is common in computing devices to have DRAM memory coupled to a substrate, such as a motherboard, using a socket, such as a dual in line memory (DIMM) socket. However, a physical layout of DRAM chips and socket connections on a DIMM device takes up a large amount of space. It is desirable to reduce an amount of space for DRAM memory. Additionally, communication through a socket interface is slower and less reliable than direct connection to a motherboard using solder connections. The additional component of the socket interface adds cost to the computing device.

Using examples of memory devices in the present disclosure, a physical size of a memory device is reduced for a given DRAM memory capacity. Speed is improved due to the direct connection to the substrate, and cost is reduced by eliminating the socket component.

In operation, a possible data speed from a host device may be higher than interconnection components to DRAM dies such as trace lines, TSVs, wire bonds, etc. can handle. The addition of a buffer die 300 (or other form of buffer assembly) allows fast data interactions from a host device to be buffered. In the example of FIG. 3, the host interface 312 is configured to operate at a first data speed. In one example, the first data speed may match the speed that the host device is capable of delivering.

In one example, the DRAM interface 314 is configured to operate at a second data speed, slower than the first data speed. In one example, the DRAM interface 314 is configured to be both slower and wider than the host interface 312. In operation, the buffer die may translate high speed data interactions on the host interface 312 side into slower, wider data interactions on the DRAM interface 314 side. Additionally, as further described below, to maintain data throughput at least approximating that of the host interface, in some examples, the buffer assembly can reallocate the connections of the host interface to multiple sub-channels associated with respective DRAM interfaces. The slower, and wider DRAM interface 314 may be configured to substantially match the capacity of the narrower, higher speed host interface 312. In this way, more limited interconnection components to DRAM dies such as trace lines, TSVs, wire bonds, etc. are able to handle the capacity of interactions supplied from the faster host device. Though one example host interface (with both CA pins and DQ pins) to buffer die 300 is shown, buffer die 300 may include multiple host interfaces for separate data paths that are each mapped by buffer die 300 to multiple DRAM interfaces, in a similar manner.

In one example, the host device interface 312 includes a first number of data paths, and the DRAM interface 314 includes a second number of data paths greater than the first number of data paths. In one example, circuitry in the buffer die 300 maps data and commands from the first number of data paths to the second number of data paths. In such a configuration, the second number of data paths provide a slower and wider interface, as described above.

In one example the command/address pins 324 of the host device interface 312 include a first number of command/address paths, and on a corresponding DRAM interface 314 side of the buffer die 300, the DRAM interface 314 includes a second number of command/address paths that is larger than the first number of command/address paths. In one example, the second number of command/address paths is twice the first number of command/address paths. In one example, the second number of command/address paths is more than twice the first number of command/address paths. In one example, the second number of command/address paths is four times the first number of command/address paths. In one example, the second number of command/address paths is eight times the first number of command/address paths.

In one example, a given command/address path on the DRAM interface 314 side of the buffer die 300 is in communication with only a single DRAM die. In one example, a given command/address path on the DRAM interface 314 side of the buffer die 300 is in communication with multiple DRAM dies. In one example, a given command/address path on the DRAM interface 314 side of the buffer die 300 is in communication with 4 DRAM dies. In one example, a given command/address path on the DRAM interface 314 side of the buffer die 300 is in communication with 16 DRAM dies.

In one example the data pins 322 of the host device interface 312 include a first number of data paths, and on a corresponding DRAM interface 314 side of the buffer die 300, the DRAM interface 314 includes a second number of data paths that is larger than the first number of data paths. In one example, the second number of data paths is twice the first number of data paths. In one example, the second number of data paths is more than twice the first number of data paths. In one example, the second number of data paths is four times the first number of data paths. In one example, the second number of data paths is eight times the first number of data paths.

In one example, a data path on the DRAM interface 314 side of the buffer die 300 is in communication with only a single DRAM die. In one example, a given data path on the DRAM interface 314 side of the buffer die 300 is in communication with multiple DRAM dies. In one example, a given data path on the DRAM interface 314 side of the buffer die 300 is in communication with 4 DRAM dies. In one example, a given data path on the DRAM interface 314 side of the buffer die 300 is in communication with 16 DRAM dies.

In one example, the host interface 312 includes different speeds for command/address pins 324, and for data pins 322. In one example, data pins 322 of the host interface are configured to operate at 6.4 Gb/s. In one example, command/address pins 324 of the host interface are configured to operate at 3.2 Gb/s.

In one example, the DRAM interface 314 of the buffer die 300 slows down and widens the communications from the host interface 312 side of the buffer die 300. In one example, where a given command/address path from the host interface 312 is mapped to two command/address paths on the DRAM interface 314, a speed at the host interface is 3.2 Gb/s, and a speed at the DRAM interface 314 is 1.6 Gb/s.

In one example, where a given data path from the host interface 312 is mapped to two data paths on the DRAM interface 314, a speed at the host interface is 6.4 Gb/s, and a speed at the DRAM interface 314 is 3.2 Gb/s, where each data path is in communication with a single DRAM die in a stack of DRAM dies. In one example, where a given data path from the host interface 312 is mapped to four data paths on the DRAM interface 314, a speed at the host interface is 6.4 Gb/s, and a speed at the DRAM interface 314 is 1.6 Gb/s, where each data path is in communication with four DRAM dies in a stack of DRAM dies. In one example, where a given data path from the host interface 312 is mapped to eight data paths on the DRAM interface 314, a speed at the host interface is 6.4 Gb/s, and a speed at the DRAM interface 314 is 0.8 Gb/s, where each data path is in communication with 16 DRAM dies in a stack of DRAM dies.

In one example, a pulse amplitude modulation (PAM) protocol is used to communicate on the DRAM interface 314 side of the buffer die 300. In one example, the PAM protocol includes PAM-4, although other PAM protocols are within the scope of the invention. In one example, the PAM protocol increases the data bandwidth. In one example, where a given data path from the host interface 312 is mapped to four data paths on the DRAM interface 314, a speed at the host interface is 6.4 Gb/s, and a speed at the DRAM interface 314 is 0.8 Gb/s using a PAM protocol, where each data path is in communication with four DRAM dies in a stack of DRAM dies. In one example, where a given data path from the host interface 312 is mapped to eight data paths on the DRAM interface 314, a speed at the host interface is 6.4 Gb/s, and a speed at the DRAM interface 314 is 0.4 Gb/s using a PAM protocol, where each data path is in communication with 16 DRAM dies in a stack of DRAM dies.

A number of pins needed to communicate between the buffer die 300 and an example 16 DRAM dies varies depending on the number of command/address paths on the DRAM interface 314 side of the buffer die 300, and on the number of DRAM dies coupled to each data path. The following table show a number of non-limiting examples of pin counts and corresponding command/address path configurations.

| host CA paths | host speed (Gb/s) | DRAM CA paths | DRAM speed (Gb/s) | # dies coupled to DRAM path | # pins |
|---|---|---|---|---|---|
| 15 | 3.2 | 30 | 1.6 | 16 | 480 |
| 15 | 3.2 | 30 | 1.6 | 4 | 120 |
| 15 | 3.2 | 30 | 1.6 | 16 | 30 |
| 15 | 3.2 | 30 | 0.8 PAM-4 | 4 | 120 |
| 15 | 3.2 | 30 | 0.8 PAM-4 | 16 | 30 |

A number of pins needed to communicate between the buffer die 300 and an example 16 DRAM dies varies depending on the number of data paths on the DRAM interface 314 side of the buffer die 300, and on the number of DRAM dies coupled to each data path. The following table show a number of non-limiting examples of pin counts and corresponding data path configurations.

| host data paths | host speed (Gb/s) | DRAM data paths | DRAM speed (Gb/s) | # dies coupled to DRAM path | # pins |
|---|---|---|---|---|---|
| 36 | 6.4 | 72 | 3.2 | 1 | 1152 |
| 36 | 6.4 | 144 | 1.6 | 4 | 576 |
| 36 | 6.4 | 288 | 0.8 | 16 | 288 |
| 36 | 6.4 | 144 | 0.8 PAM-4 | 4 | 576 |
| 36 | 6.4 | 288 | 0.4 PAM-4 | 16 | 288 |

As illustrated in selected examples below, the number of pins in the above tables may be coupled to the DRAM dies in the stack of DRAM dies in a number of different ways. In one example, wire bonds are used to couple from the pins to the number of DRAM dies. In one example, TSVs are used to couple from the pins to the number of DRAM dies. Although wire bonds and TSVs are used as an example, other communication pathways apart from wire bonds and TSVs are also within the scope of the invention.

Figure 4:
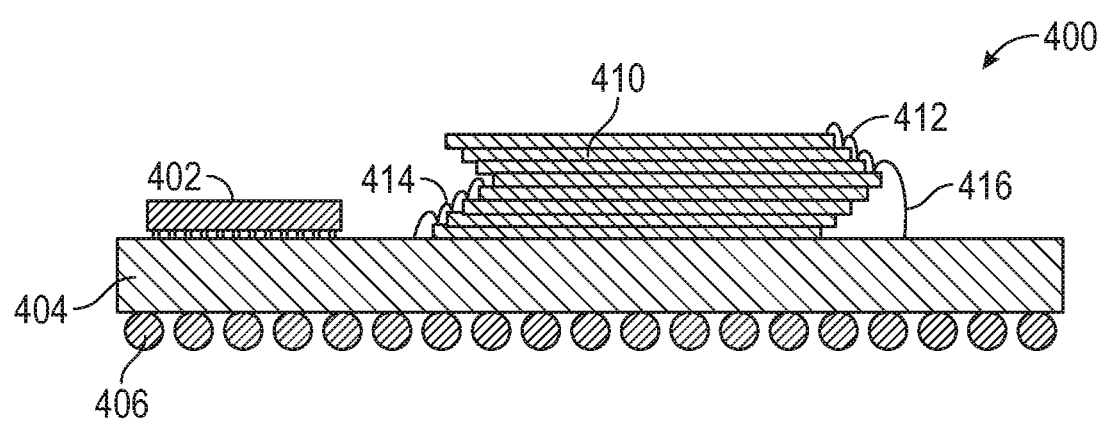
FIG. 4 illustrates generally an example of a memory device.

FIG. 4 shows another example of a memory device 400. The memory device 400 includes a buffer die 402 coupled to a substrate 404. The memory device 400 also includes a stack of DRAM dies 410 coupled to the substrate 404. In the example of FIG. 4, the stack of DRAM dies 410 are staggered in at least one stair step configuration. The Example of FIG. 4 shows two different stagger directions in the stair stepped stack of DRAM dies 410. Similar to the configuration of FIG. 2, in the illustrated stair step configuration, an exposed surface portion 412 is used for a number of wire bond interconnections.

Multiple wire bond interconnections 414, 416 are shown from the dies in the stack of DRAM dies 410 to the substrate 404. Additional conductors (not shown) on or within the substrate 404 further couple the wire bond interconnections 414, 416 to the buffer die 402. The buffer die 402 is shown coupled to the substrate 404 using one or more solder interconnections, such as a solder ball array. A number of substrate solder interconnections 406 are further shown on a bottom side of the substrate 404 to further transmit signals and data from the buffer die into a motherboard and eventually to a host device.

In the example of FIG. 4, the multiple wire bond interconnections 414, 416 are serially connected up the multiple stacked DRAM dies. In selected examples, a single wire bond may drive a load in more than one DRAM die. In such an example, the wire bond interconnections may be serially connected as shown in FIG. 4. In one example, a single wire bond may be serially connected to four DRAM dies. In one example, a single wire bond may be serially connected to eight DRAM dies. In one example, a single wire bond may be serially connected to sixteen DRAM dies. Other numbers of serially connected DRAM dies are also within the scope of the invention. Additionally, CA connections of the DRAM interface may be made to a first number of the DRAM dies, while the corresponding DQ connections of the DRAM interface may be made to a second number of the DRAM dies different from the first number.

Figure 5A:
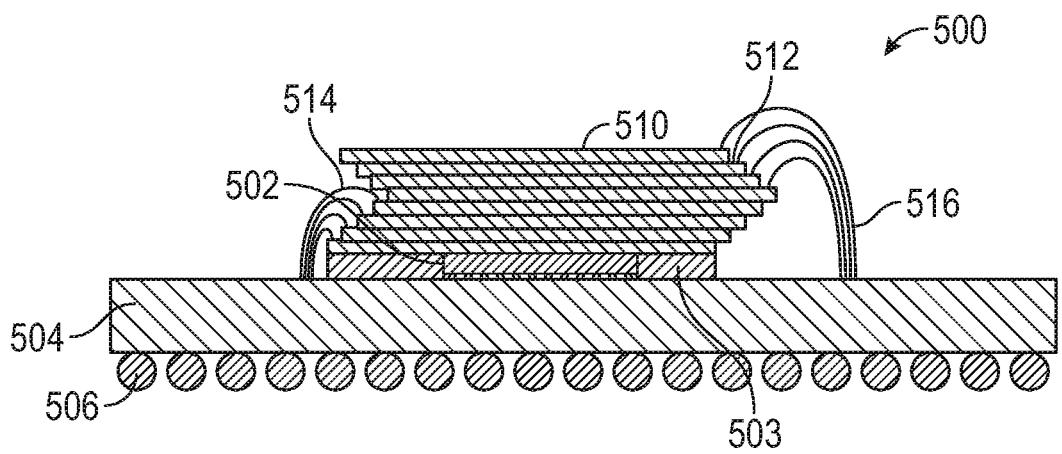
FIGS. 5A-5D illustrate example memory devices.

FIG. 5A shows another example of a memory device 500. The memory device 500 includes a buffer die 502 coupled to a substrate 504. The memory device 500 also includes a stack of DRAM dies 510 coupled to the substrate 504. In the example of FIG. 5A, the stack of DRAM dies 510 are staggered in at least one stair step configuration. The Example of FIG. 5 shows two different stagger directions in the stair stepped stack of DRAM dies 510. In the illustrated stair step configuration, an exposed surface portion 512 is used for a number of wire bond interconnections.

Multiple wire bond interconnections 514, 516 are shown from the dies in the stack of DRAM dies 410 to the substrate 404. Additional conductors (not shown) on or within the substrate 504 further couple the wire bond interconnections 514, 451616 to the buffer die 502. The buffer die 502 is shown coupled to the substrate 504 using one or more solder interconnections, such as a solder ball array. A number of substrate solder interconnections 506 are further shown on a bottom side of the substrate 504 to further transmit signals and data from the buffer die into a motherboard and eventually to a host device.

In the example of FIG. 5A, the buffer die 502 is located at least partially underneath the stack of DRAM dies 510. In one example, an encapsulant 503 at least partially surrounds the buffer die 502. The example of FIG. 5A further reduces an areal footprint of the memory device 500. Further, an interconnect distance between the stack of DRAM dies 510 and the buffer die 502 is reduced.

Figure 5B:
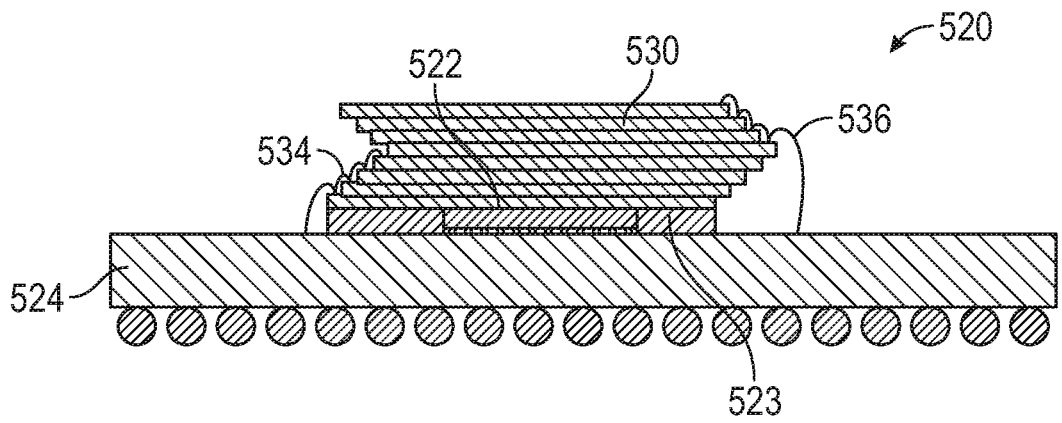

FIG. 5B shows another example of a memory device 520. The memory device 520 includes a buffer die 522 coupled to a substrate 524. The memory device 520 also includes a stack of DRAM dies 530 coupled to the substrate 524. Multiple wire bond interconnections 534, 536 are shown from the dies in the stack of DRAM dies 530 to the substrate 524. In the example of FIG. 5B, the multiple wire bond interconnections 534, 536 are serially connected up the multiple stacked DRAM dies. In one example, a single wire bond may be serially connected to four DRAM dies. In one example, a single wire bond may be serially connected to eight DRAM dies. In one example, a single wire bond may be serially connected to sixteen DRAM dies. Other numbers of serially connected DRAM dies are also within the scope of the invention.

Figures 5C, 5D:
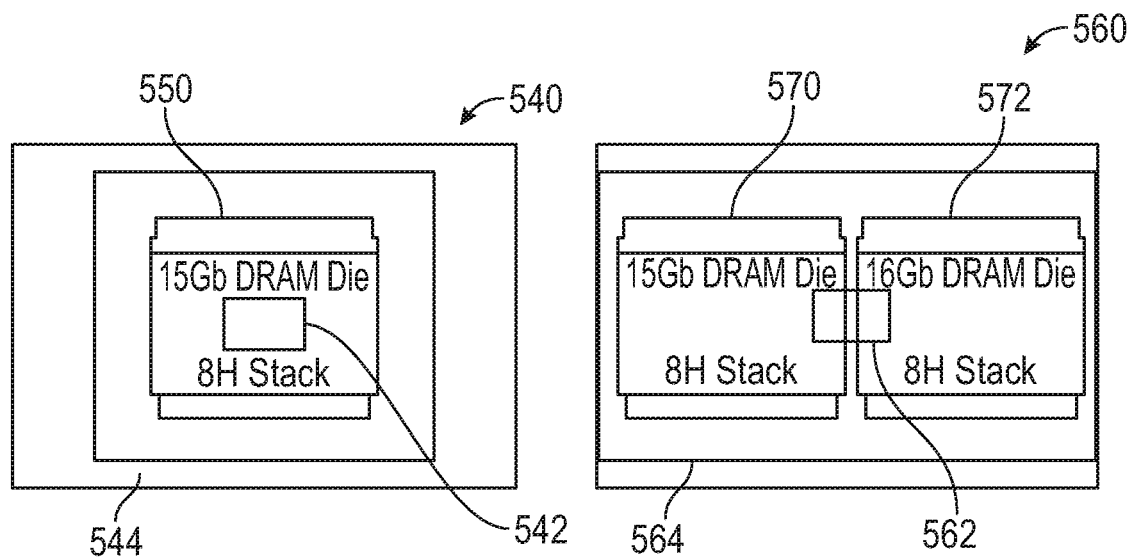

FIG. 5C shows a top view of a memory device 540 similar to memory devices 500 and 520. In the example of FIG. 5C, a buffer die 542 is shown coupled to a substrate 544, and located completely beneath a stack of DRAM dies 550. FIG. 5D shows a top view of a memory device 560 similar to memory devices 500 and 520. In FIG. 5D, a buffer die 562 is coupled to a substrate 564, and located partially underneath a portion of a first stack of DRAM dies 570 and a second stack of DRAM dies 572. In one example, a shorter stack of DRAM dies provides a shorter interconnection path, and a higher manufacturing yield. In selected examples, it may be desirable to use multiple shorter stacks of DRAM dies for these reasons. One tradeoff of multiple shorter stacks of DRAM dies is a larger areal footprint of the memory device 560.

Figure 6:
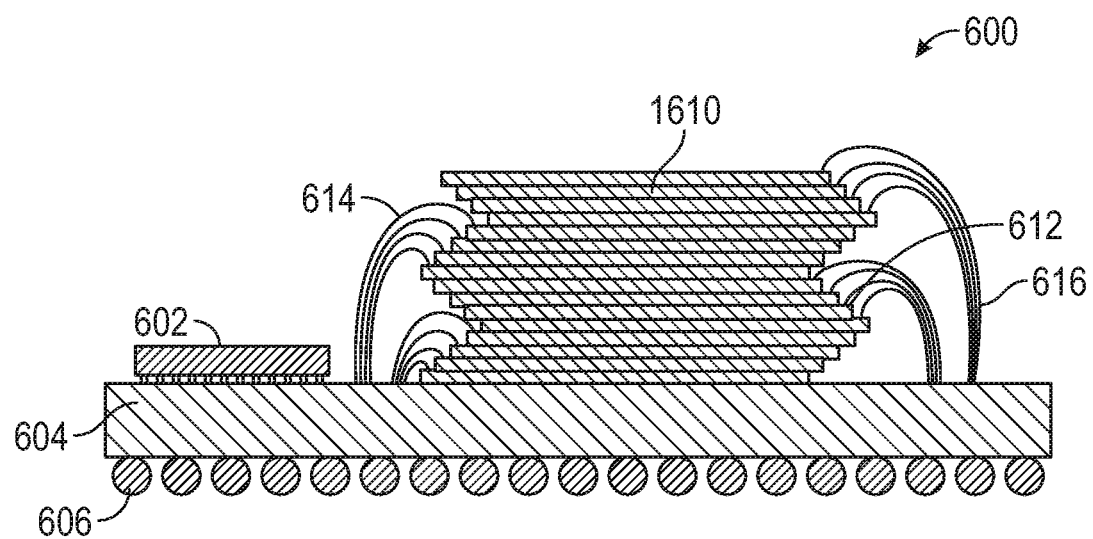
FIG. 6 illustrates an example of a memory device.

FIG. 6 shows another example of a memory device 600. The memory device 600 includes a buffer die 602 coupled to a substrate 604. The memory device 600 also includes a stack of DRAM dies 610 coupled to the substrate 604. In the example of FIG. 6, the stack of DRAM dies 610 are staggered in at least one stair step configuration. The Example of FIG. 6 shows four staggers, in two different stagger directions in the stair stepped stack of DRAM dies 610. The stack of DRAM dies 610 in FIG. 6 includes 16 DRAM dies, although the invention is not so limited. Similar to other stair step configurations shown, in FIG. 6, an exposed surface portion 612 is used for a number of wire bond interconnections.

Multiple wire bond interconnections 614, 616 are shown from the dies in the stack of DRAM dies 610 to the substrate 604. Additional conductors (not shown) on or within the substrate 604 further couple the wire bond interconnections 614, 616 to the buffer die 602. The buffer die 602 is shown coupled to the substrate 604 using one or more solder interconnections, such as a solder ball array. A number of substrate solder interconnections 606 are further shown on a bottom side of the substrate 604 to further transmit signals and data from the buffer die into a motherboard and eventually to a host device.

Figure 7:
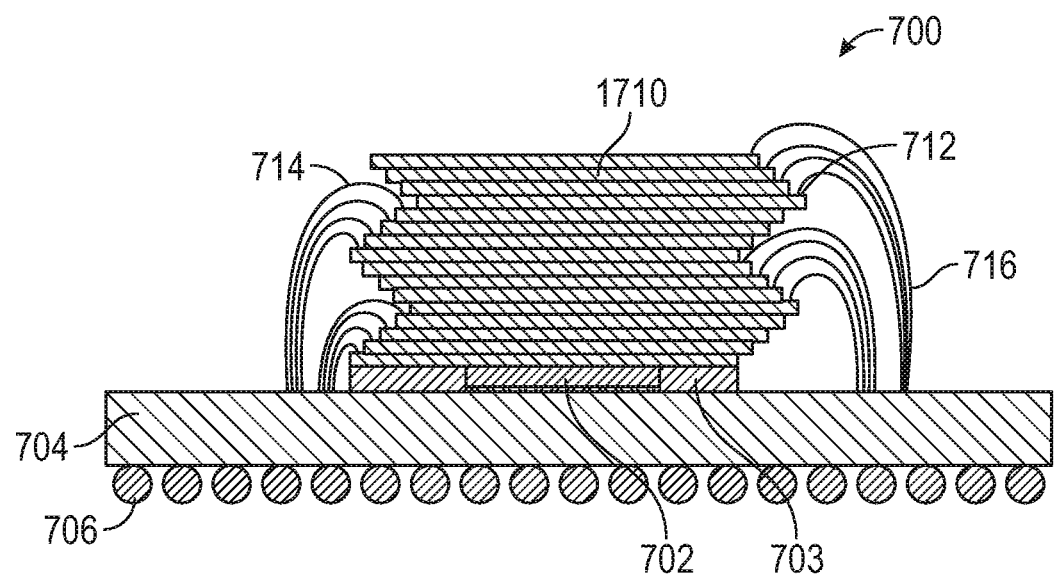
FIG. 7 illustrates an example of a memory device.

FIG. 7 shows another example of a memory device 700. The memory device 700 includes a buffer die 702 coupled to a substrate 704. The memory device 700 also includes a stack of DRAM dies 710 coupled to the substrate 704. In the example of FIG. 7, the stack of DRAM dies 710 are staggered in at least one stair step configuration. The Example of FIG. 7 shows four staggers, in two different stagger directions in the stair stepped stack of DRAM dies 710. The stack of DRAM dies 710 in FIG. 7 includes 16 DRAM dies, although the invention is not so limited. Similar to other stair step configurations shown, in FIG. 7, an exposed surface portion 712 is used for a number of wire bond interconnections.

Multiple wire bond interconnections 714, 716 are shown from the dies in the stack of DRAM dies 710 to the substrate 704. Additional conductors (not shown) on or within the substrate 704 further couple the wire bond interconnections 714, 716 to the buffer die 702. The buffer die 702 is shown coupled to the substrate 704 using one or more solder interconnections, such as a solder ball array. A number of substrate solder interconnections 706 are further shown on a bottom side of the substrate 704 to further transmit signals and data from the buffer die into a motherboard and eventually to a host device.

In the example of FIG. 7, the buffer die 702 is located at least partially underneath the stack of DRAM dies 710. In one example, an encapsulant 703 at least partially surrounds the buffer die 702. The example of FIG. 7 further reduces an areal footprint of the memory device 700. Additionally, an interconnect distance between the stack of DRAM dies 710 and the buffer die 702 is reduced.

Figure 8A:
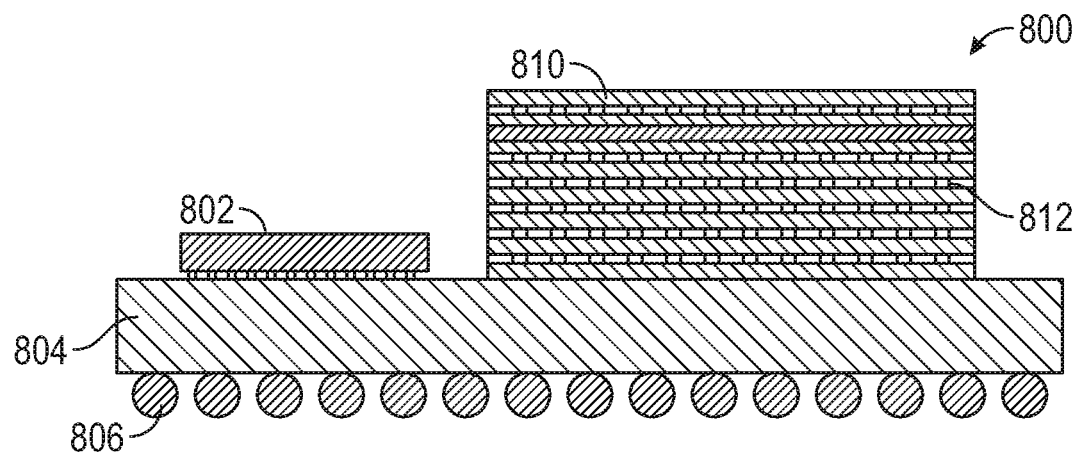
FIGS. 8A and 8B illustrate generally examples of a memory device.

FIG. 8A shows another example of a memory device 800. The memory device 800 includes a buffer die 802 coupled to a substrate 804. The memory device 800 also includes a stack of DRAM dies 810 coupled to the substrate 804. In the example of FIG. 8A, the stack of DRAM dies 810 are vertically aligned. The stack of DRAM dies 810 in FIG. 8A includes 8 DRAM dies, although the invention is not so limited.

Multiple TSV interconnections 812 are shown passing through, and communicating with one or more dies in the stack of DRAM dies 810 to the substrate 804. Additional conductors (not shown) on or within the substrate 804 further couple the TSVs 812 to the buffer die 802. The buffer die 802 is shown coupled to the substrate 804 using one or more solder interconnections, such as a solder ball array. A number of substrate solder interconnections 806 are further shown on a bottom side of the substrate 804 to further transmit signals and data from the buffer die into a motherboard and eventually to a host device.

Figure 8B:
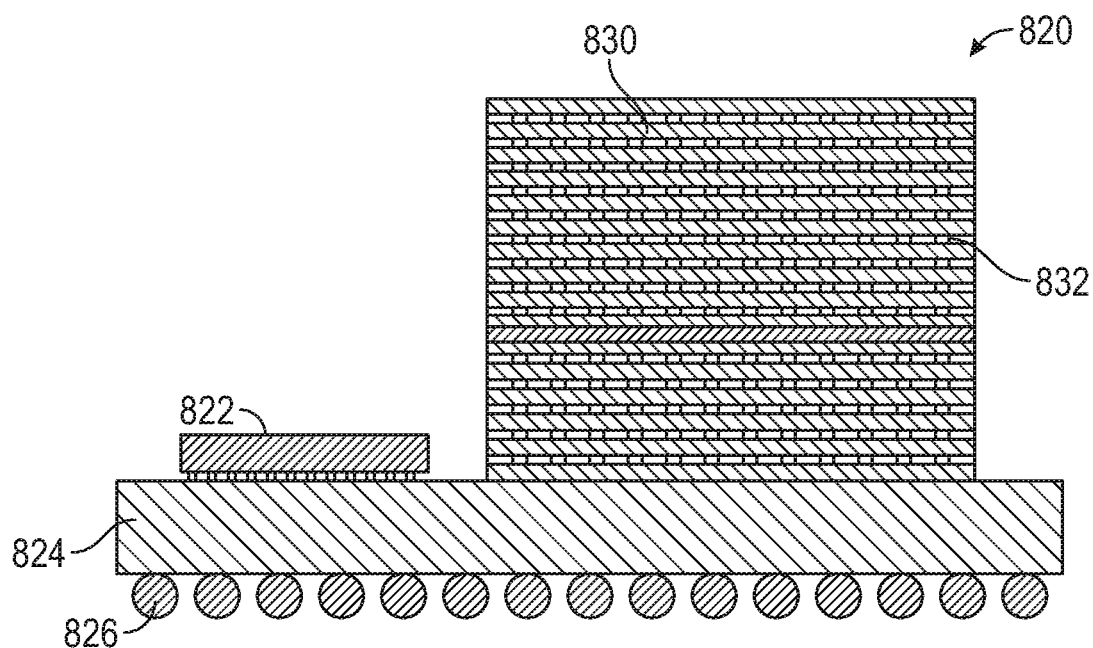

FIG. 8B shows another example of a memory device 820. The memory device 820 includes a buffer die 822 coupled to a substrate 824. The memory device 820 also includes a stack of DRAM dies 830 coupled to the substrate 824. In the example of FIG. 8B, the stack of DRAM dies 830 are vertically aligned. The stack of DRAM dies 830 in FIG. 8B includes 16 DRAM dies, although the invention is not so limited.

Multiple TSV interconnections 832 are shown passing through, and communicating with one or more dies in the stack of DRAM dies 830 to the substrate 824. Additional conductors (not shown) on or within the substrate 824 further couple the TSVs 832 to the buffer die 822. The buffer die 822 is shown coupled to the substrate 824 using one or more solder interconnections, such as a solder ball array. A number of substrate solder interconnections 826 are further shown on a bottom side of the substrate 824 to further transmit signals and data from the buffer die into a motherboard and eventually to a host device.

Figure 9:
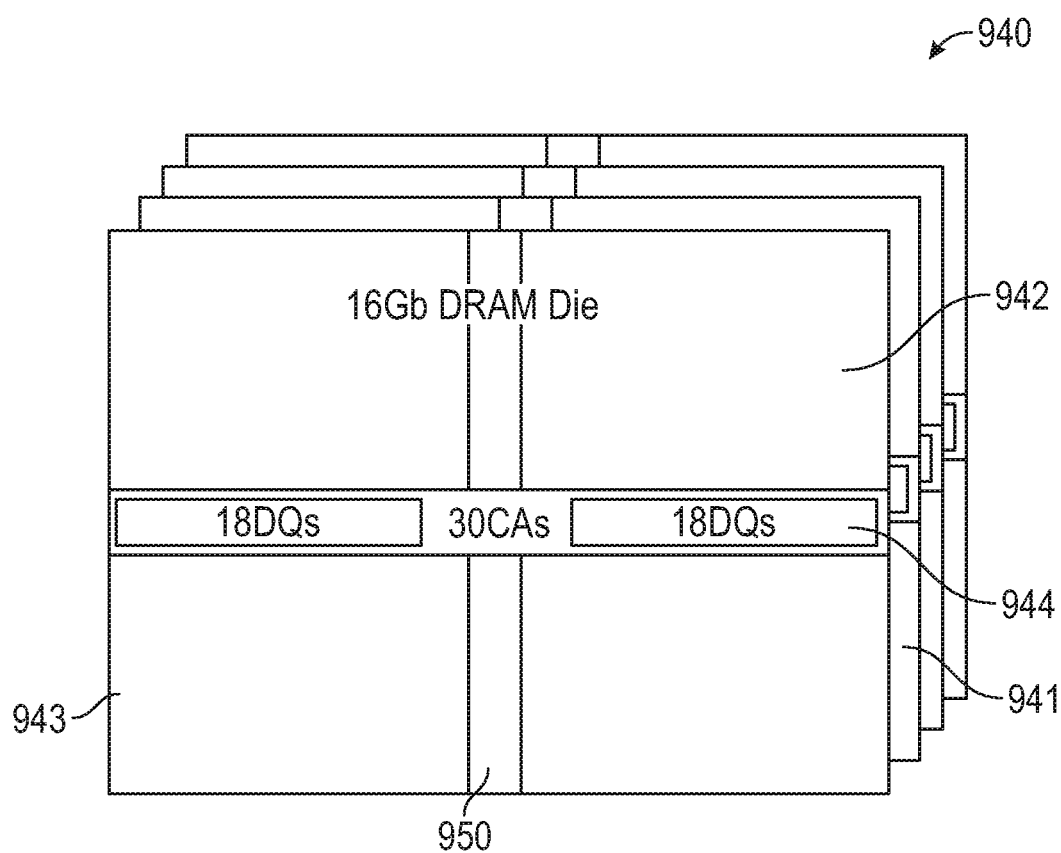
FIG. 9 illustrates generally a block diagram of an example stack of four DRAM dies that may be included in a stack of DRAM dies according to any of the examples in the present disclosure.

FIG. 9 illustrates generally a block diagram of an example stack of four DRAM dies 940 that may be included in a stack of DRAM dies according to any of the examples in the present disclosure. Each die in the stack 940 includes a storage region 942 that contains arrays of memory cells. A single data I/O stripe 944 is shown passing from a first side 941 to a second side 943 of the stack 940. In one example, contacts may be formed on edges of the data I/O stripe 944 on one or both sides 941, 943 of the data I/O stripe 944. Contacts may be connected to wire bonds as described in examples above. In other examples, TSVs may be coupled to the data I/O stripe 944, at sides 941, 943, or other locations along the first data I/O stripe 944. In certain examples, the single data I/O stripe 944 includes 32 contacts for connection to wire bonds or TSVs. In one example, all four of the dies in the stack 940 can be driven by a single data path as described in examples above. In certain examples, the stack can include a command/address stripe 950. In the example shown, the command/address stripe 950 includes 30 contacts for connection to wire bonds or TSVs.

Figure 10:
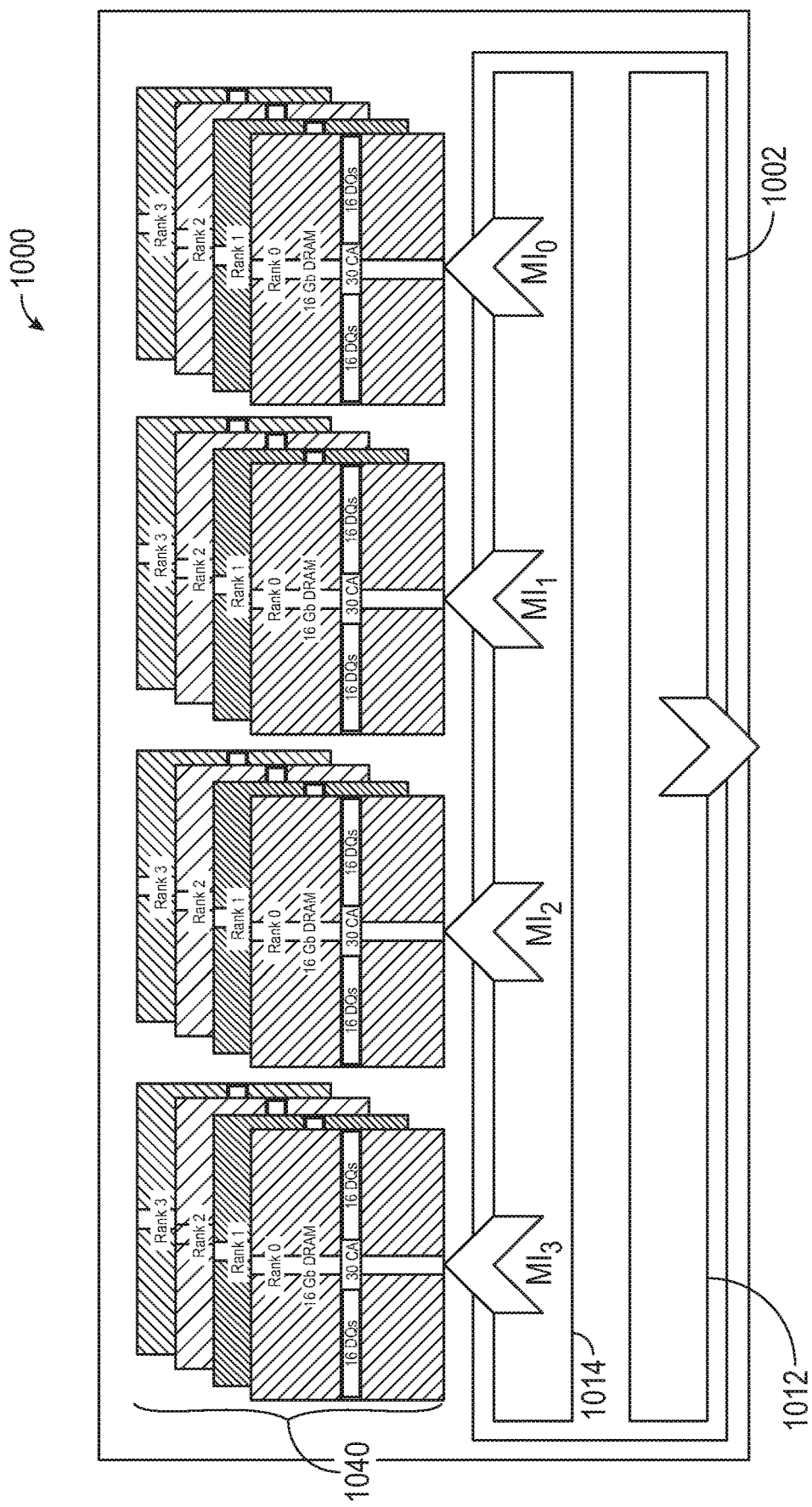
FIG. 10 illustrate generally an example of a modularized base architecture for an example memory module that can be expanded to provide three different levels of error correction.

FIG. 10 illustrates generally an example of a modularized base architecture for an example memory module 1000 that can be expanded to provide three different levels of error correction. The base architecture of the memory module 1000 can include a buffer die 1002 for interfacing between a host interface 1012 and a DRAM interface 1014 including multiple data paths ($MI_0$-$MI_3$) communicatively coupled to one or more stacks 1040 of ranked memory die. In the illustrated example, the memory module 1002 can include 16 memory die arranged in four ranks (RANK 0-3). Each data path ($MI_0$-$MI_3$) of the DRAM interface 1014 can be simultaneously coupled to a single die of each rank (RANK 1-3). As such, the memory die can be arranged in ranks wherein each rank includes four, 32 DO-pin DRAM die. The base architecture or configuration of the memory module 1002 of FIG. 10 does not provide error correction and can service a 32-bit host data bus or interface 1012.

Figure 11:
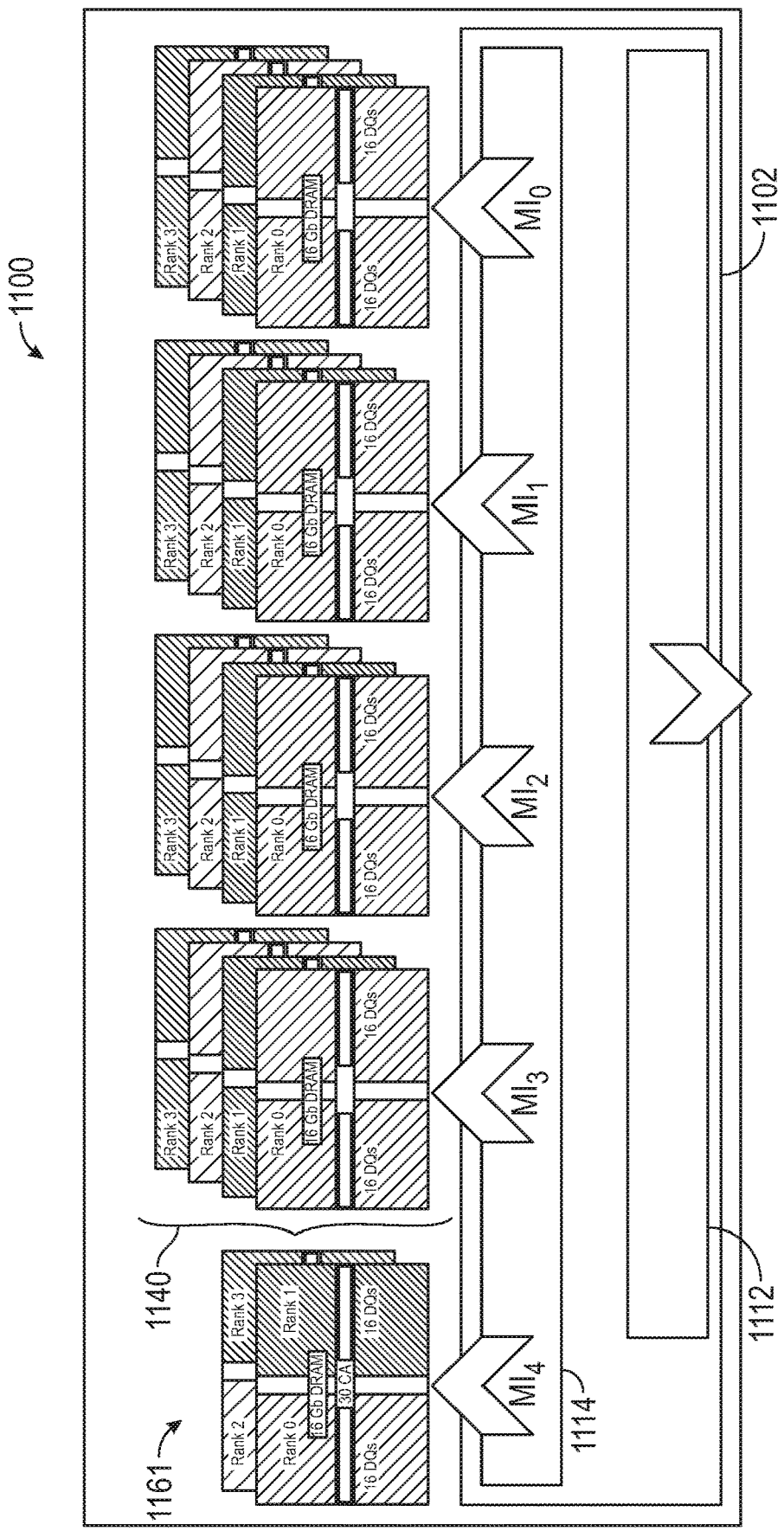
FIG. 11 illustrates generally an expansion of the base architecture to provide an example memory module that provides error correction code (ECC) information or functionality.

FIG. 11 illustrates generally an expansion of the base architecture to provide an example memory module 1100 that provides error correction code (ECC) information or functionality. The base architecture of the memory module 1100 can include a buffer die 1102 for interfacing between a host interface 1112 and a DRAM interface 1114 including multiple data paths ($MI_0$-$MI_3$) communicatively coupled to one or more stacks 1140 of ranked memory die. In the illustrated example, the memory module 1102 can include 16 memory die arranged in four ranks (RANK 0-3). In addition to the base architecture, the example memory module 1102 includes an additional one or more ECC die 1161 to accommodate ECC as well as an additional one or more data paths (e.g., $MI_4$) of the DRAM interface 1114. In the illustrated example, each ECC die of the one or more ECC die 1161 can accommodate ECC for two of the four ranks (RANKS 0-3) such that the example memory module 1100, configured to provide ECC, can include 18 DRAM die and can service a 36-bit host data bus 1112.

Figure 12:
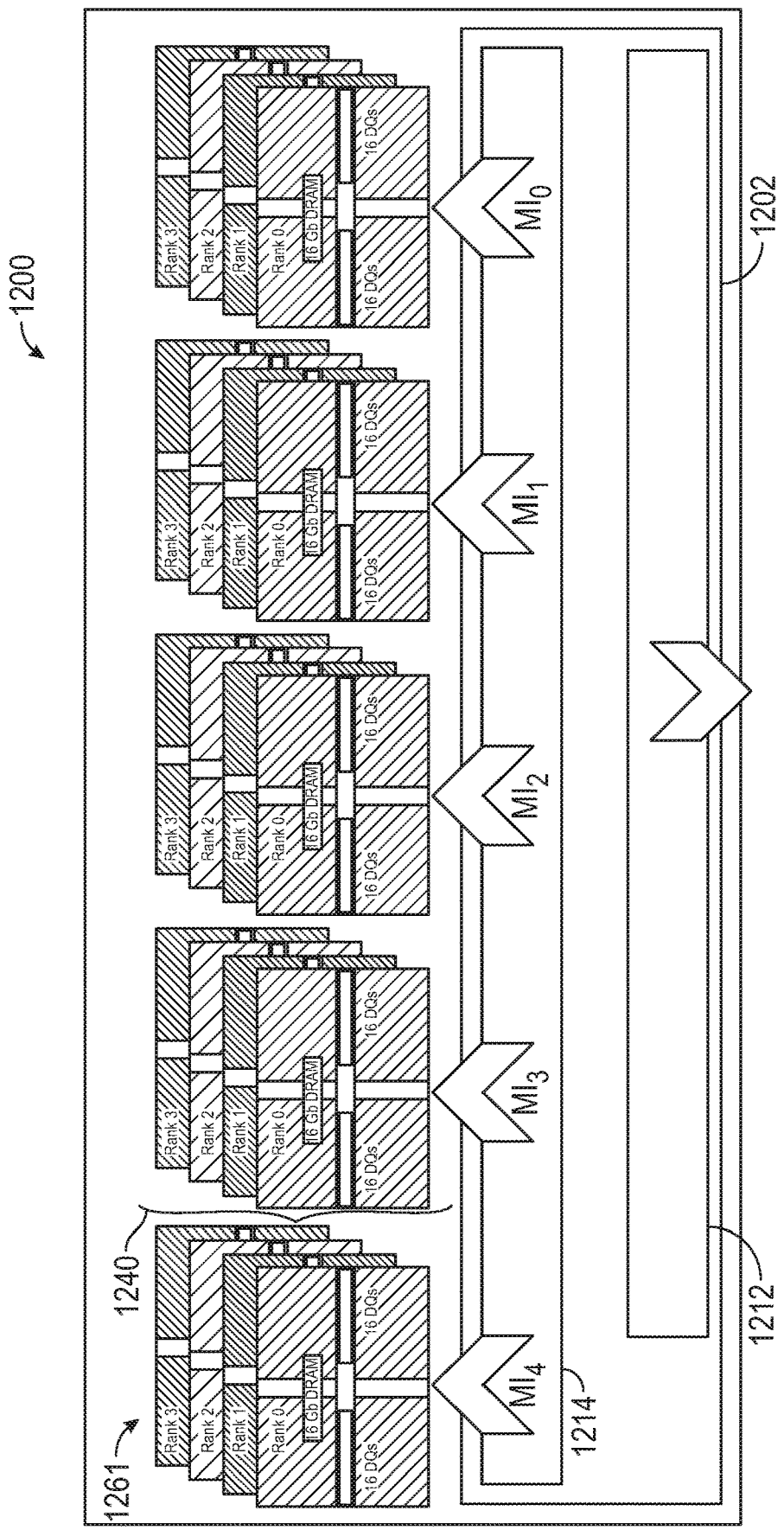
FIG. 12 illustrates generally a further expansion of the base architecture to provide an example memory module that provides full ECC/SDDC capability.

FIG. 12 illustrates generally a further expansion of the base architecture to provide an example memory module 1200 that provides full ECC/SDDC capability. The base architecture of the memory module 1200 can include a buffer die 1202 for interfacing between a host interface 1212 and a DRAM interface 1214 including multiple data paths ($MI_0$-$MI_3$) communicatively coupled to one or more stacks 1240 of ranked memory die. In the illustrated example, the memory module 1202 can include 16 memory die arranged in four ranks (RANK 0-3). In addition to the base architecture, the example memory module 1200 can include an additional DRAM die 1261 for each rank (Rank 0-3) to accommodate ECC/SDDC, as well as, an additional one or more data paths (e.g., $MI_4$) of the DRAM interface 1214. In the illustrated example, a single ECC/SDDC DRAM die can be associated with each rank, such that the example memory module 1200, configured to provide full ECC/SDDC, can include 20 DRAM die and can service a 40-bit host data bus 1212.

Figure 13A:
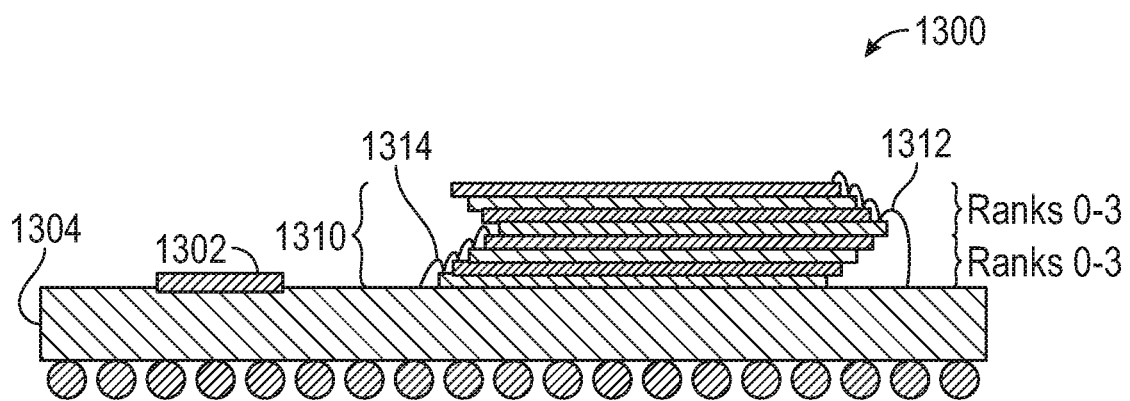
FIGS. 13A and 13B illustrate generally example physical configurations of the example memory module of FIG. 10.
Figure 13B:
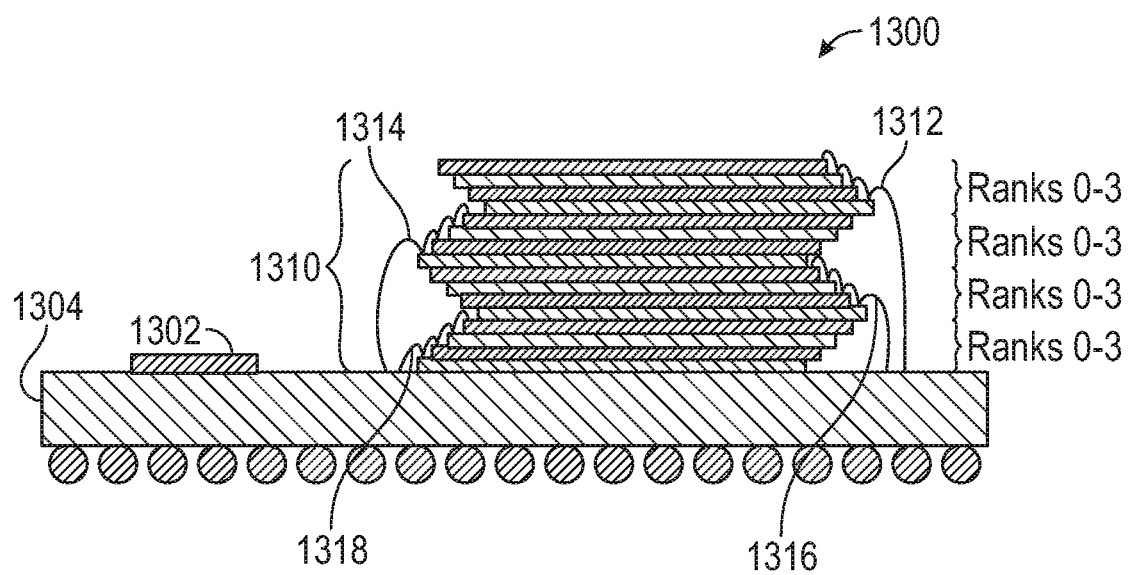

FIGS. 13A and 13B illustrate generally example physical configurations 1300 of the example memory module of FIG. 10. FIG. 13A illustrates generally a single stack of DRAM dies 1310 of an example two-stack configuration. Each stack of the two-stack configuration can include eight die. Each stack of the two-stack configuration can include two die from each rank of the four ranks (RANK 0-3). The die of each stack can be coupled to the buffer 1302 via wire bonds 1312, 1314 extending from two data paths of the DRAM interface of the buffer 1302. In an example, a first data path 1312 can be daisy chained to four die of a stack. Each of the four die can be associated with a different rank of the four ranks. In some examples, the buffer die 1302 can be offset from each of the stacks such as illustrated in FIG. 13A. In other examples, the buffer die can be located under one of the stacks as shown in FIG. 5A, 502 or FIG. 5B, 522. In some examples, the buffer die can be positioned under both stacks as is shown in FIG. 5D, 562.

FIG. 13B illustrates generally a single stack configuration of an example memory module 1300 based on the base architecture discussed above. The single stack 1310 of DRAM memory die includes all 16 DRAM die of the memory module 1300. The single stack 1310 can include four die from each rank of the four ranks (RANK 0-3). The die of the stack 1310 can be coupled to the buffer via wire bonds 1312, 1314, 1316, 1318 extending from four data paths of the DRAM interface of the buffer die 1302. In an example, each data path can be daisy chained to a group of four die of the stack 1310. Each of the four die can be associated with a different rank of the four ranks (RANKS 0-3). In some examples, the buffer die 1302 can be offset from the stack 1310 such as illustrated in FIG. 12B. In some examples, the buffer die 1302 can be positioned under the stack 1310 as is shown in FIG. 5E.

Figure 14A:
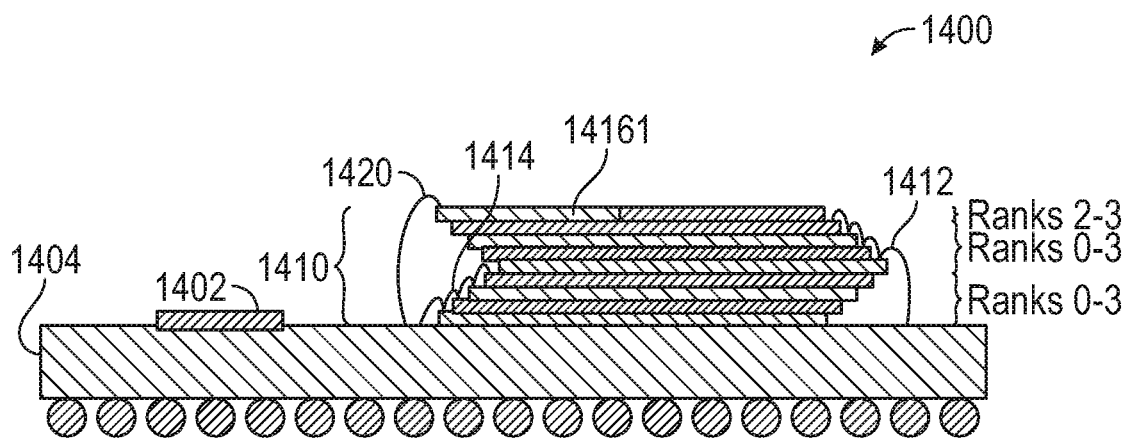
FIGS. 14A and 14B illustrate generally example physical configurations of the example memory module of FIG. 11.
Figure 14B:
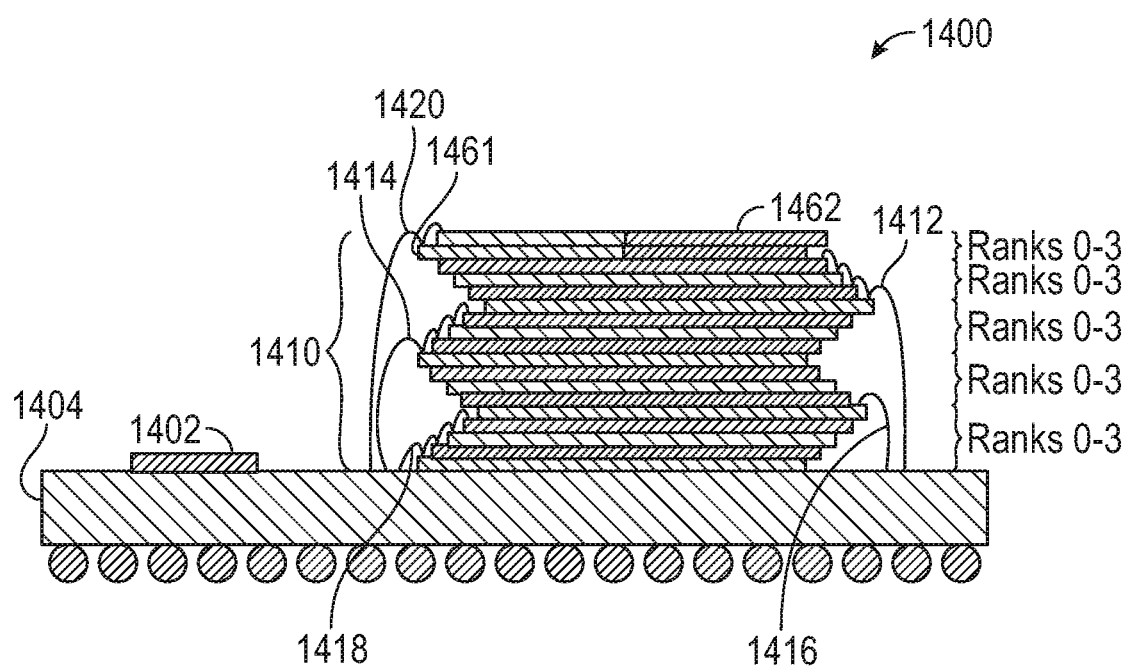

FIGS. 14A and 14B illustrate generally example physical configurations 1400 of the example memory module of FIG. 11. FIG. 14A illustrates generally a single stack of DRAM dies 1410 of an example two-stack configuration. Each stack of the two-stack configuration can include nine die. Each stack of the two-stack configuration can include two die from each rank of the four ranks (RANK 0-3). The die of each stack can be coupled to the buffer 1402 via wire bonds 1412, 1414 extending from two data paths of the DRAM interface of the buffer 1402. In an example, a first data path 1412 can be daisy chained to four die of a stack. Each of the four die can be associated with a different rank of the four ranks. In some examples, the buffer die 1402 can be offset from each of the stacks such as illustrated in FIG. 14A. In other examples, the buffer die can be located under one of the stacks as shown in FIG. 5A, 502 or FIG. 5B, 522. In some examples, the buffer die can be positioned under both stacks as is shown in FIG. 5D, 562. In addition to the basic configuration, each stack of the two-stack configuration can include one or more ECC DRAM die 1461. Each of the one or more ECC die can store ECC information of a portion of the ranks of memory. For example, the single stack of die 1410 can include a ECC die 1461 configured to store ECC information for ranks 2 and 3. The other stack (not shown) can include a second ECC die configured to store the ECC information for ranks 0 and 1. It is understood that the assignment of ECC information from each rank to each ECC die may be different than described above without departing from the scope of the present subject matter. In certain examples, the ECC die of each stack of the two-stack configuration can be coupled to the DRAM interface of the buffer die 1402 by wire bonds (e.g., 1420) of an additional data path.

FIG. 14B illustrates generally a single stack configuration of an example memory module 1400 based on the base architecture discussed above. The single stack 1410 of DRAM memory die includes all 18 DRAM die of the memory module 1400. The single stack 1410 can include four die from each rank of the four ranks (RANK 0-3). The die of the stack of ranked memory 1410 can be coupled to the buffer via wire bonds 1412, 1414, 1416, 1418 extending from four data paths of the DRAM interface of the buffer die 1402. In an example, each data path can be daisy chained to a group of four die of the stack of ranked memory 1410. Each of the four die can be associated with a different rank of the four ranks (RANKS 0-3). In some examples, the buffer die 1402 can be offset from the stack 1410 such as illustrated in FIG. 12B. In some examples, the buffer die 1402 can be positioned under the stack 1410 as is shown in FIG. 5E. In addition to the basic configuration, the single stack configuration can include one or more ECC DRAM die 1461, 1462. Each of the one or more ECC die 1461, 1462 can store ECC information of a portion of the ranks of memory. For example, the single stack of die 1410 can include two ECC die 1461, 1462 configured to store ECC information for all four ranks of memory of the stack of ranked memory 1410. It is understood that the assignment of ECC information from each rank to each ECC die 1461, 1462 may be different than described above without departing from the scope of the present subject matter. In certain examples, the ECC die of the stack 1410 of the single stack configuration of FIG. 14B can be coupled to the DRAM interface of the buffer die 1402 by a set of wire bonds 1520 of an additional data path, where the set of wire bonds 1420 couples in a daisy chain fashion to both ECC die (e.g., 1461, 1462) of the stack 1410.

Figure 15A:
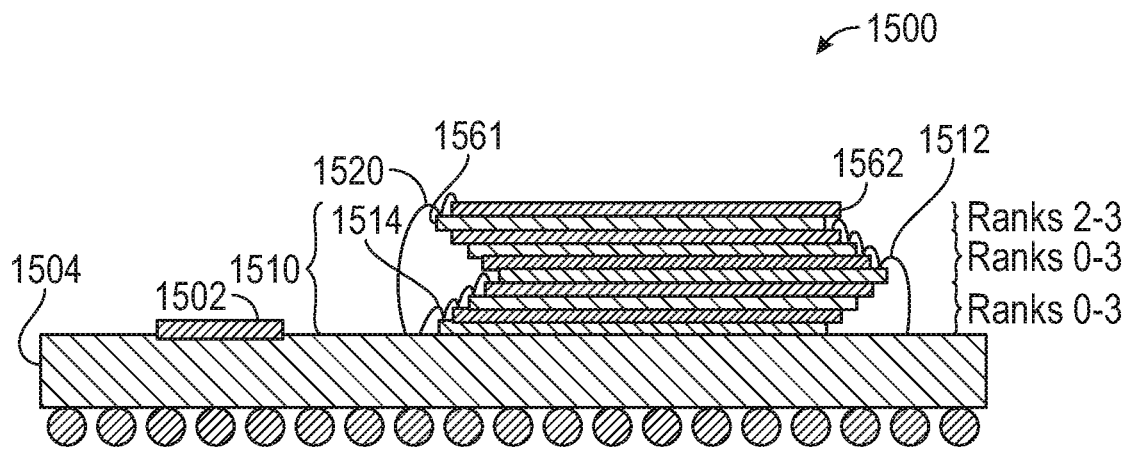
FIGS. 15A and 15B illustrate generally example physical configurations of the example memory module of FIG. 11.
Figure 15B:
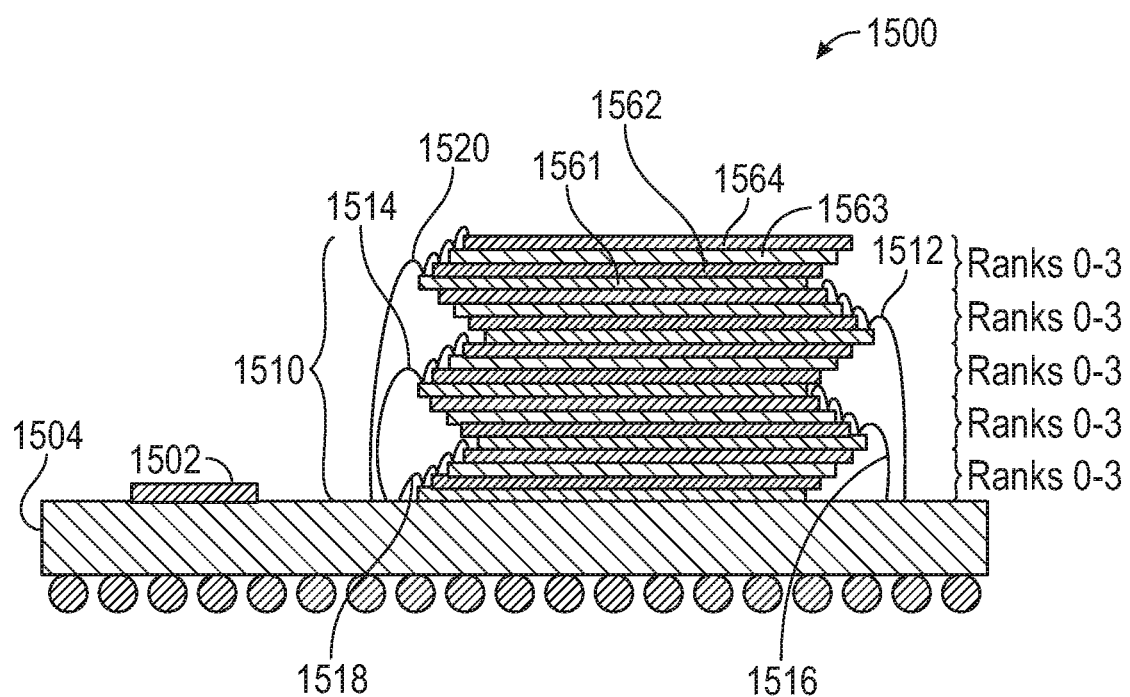

FIGS. 15A and 15B illustrate generally example physical configurations 1500 of the example memory module of FIG. 11. FIG. 15A illustrates generally a single stack of DRAM dies 1510 of an example two-stack configuration. Each stack of the two-stack configuration can include ten die. Each stack of the two-stack configuration can include two die from each rank of the four ranks (RANK 0-3). The die of each stack can be coupled to the buffer 1502 via wire bonds 1512, 1514 extending from two data paths of the DRAM interface of the buffer 1502. In an example, a first data path 1512 can be daisy chained to four die of a stack. Each of the four die can be associated with a different rank of the four ranks. In some examples, the buffer die 1502 can be offset from each of the stacks such as illustrated in FIG. 15A. In other examples, the buffer die can be located under one of the stacks as shown in FIG. 5A, 502 or FIG. 5B, 522. In some examples, the buffer die can be positioned under both stacks as is shown in FIG. 5D, 562. In addition to the basic configuration, each stack of the two-stack configuration can include one or more ECC/SDDC DRAM die 1561, 1562. Each of the one or more ECC/SDDC die can store ECC and SDDC information of one of the ranks of memory. For example, the single stack of die 1510 of FIG. 15A can include a first ECC/SDDC die 1561 configured to store ECC/SDDC information for rank 2 and a second ECC/SDDC die 1562 configured to store ECC/SDDC information for rank 3. The other stack (not shown) can include a two additional ECC/SDDC die configured to store the ECC/SDDC information for ranks 0 and 1. It is understood that the assignment of ECC/SDDC information from each rank to each ECC/ADDC die may be different than described above without departing from the scope of the present subject matter. In certain examples, the ECC/SDDC die of each stack of the two-stack configuration can be coupled to the DRAM interface of the buffer die 1502 by wire bonds of an additional data path (e.g., 1520), where each set of wire bonds couples in a daisy chain fashion to both ECC/SDDC die (e.g., 1561, 1562) of each stack.

FIG. 15B illustrates generally a single stack configuration of an example memory module 1500 based on the base architecture discussed above. The single stack 1510 of DRAM memory die includes all 20 DRAM die of the memory module 1500. The single stack 1510 can include four die from each rank of the four ranks (RANK 0-3). The die of the stack of ranked memory 1510 can be coupled to the buffer via wire bonds 1512, 1514, 1516, 1518 extending from four data paths of the DRAM interface of the buffer die 1502. In an example, each data path can be daisy chained to a group of four die of the stack of ranked memory 1510. Each of the four die can be associated with a different rank of the four ranks (RANKS 0-3). In some examples, the buffer die 1502 can be offset from the stack 1510 such as illustrated in FIG. 12B. In some examples, the buffer die 1502 can be positioned under the stack 1510 as is shown in FIG. 5E. In addition to the basic configuration, the single stack configuration of FIG. 15B can include one or more ECC/SDDC DRAM die 1561, 1562, 1563, 1564. Each of the one or more ECC die 1561, 1562, 1563, 1564 can store ECC/SDDC information of one of the ranks of memory. For example, the single stack of die 1510 can include four ECC/SDCC die configured to store ECC information for all four ranks of memory of the stack of ranked memory 1510. It is understood that the assignment of ECC information from each rank to each ECC die may be different than described above without departing from the scope of the present subject matter. In certain examples, the ECC/SDDC die 1561, 1562, 1563, 1564 of the stack 1510 of the single-stack configuration of FIG. 15B can be coupled to the DRAM interface of the buffer die 1502 by a set of wire bonds 1520 of an additional data path, where each set of wire bonds couples in a daisy chain fashion to each of the ECC/SDDC die 1561, 1562, 1563, 1564 of the stack 1510.

Figure 16:
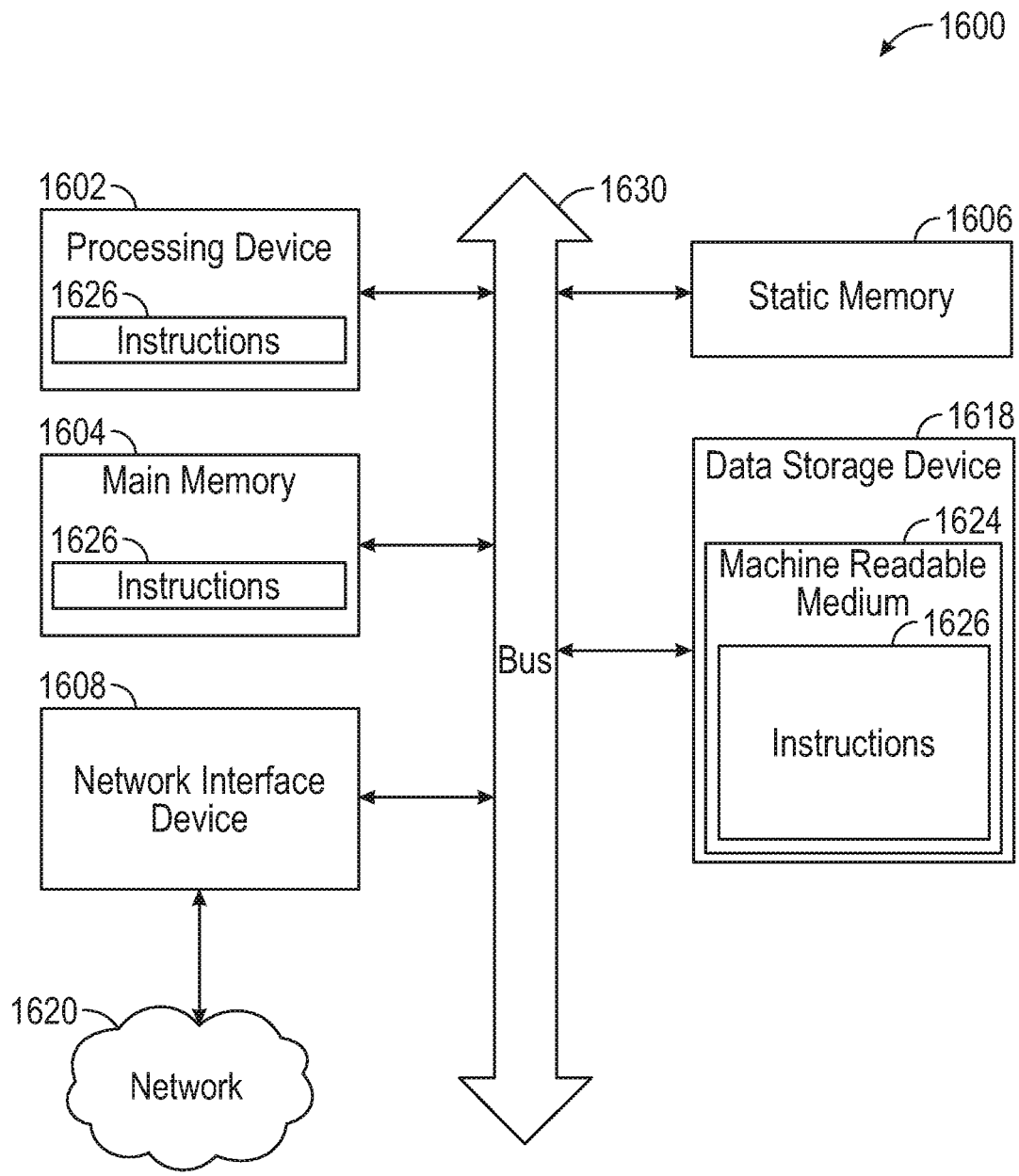
FIG. 16 illustrates a block diagram of an example machine (e.g., a host system) which may include one or more memory devices and/or systems as described above.

FIG. 16 illustrates a block diagram of an example machine (e.g., a host system) 1600 which may include one or more memory devices and/or systems as described above. In alternative embodiments, the machine 1600 may operate as a standalone device or may be connected (e.g., networked) to other machines. In a networked deployment, the machine 1600 may operate in the capacity of a server machine, a client machine, or both in server-client network environments. In an example, the machine 1600 may act as a peer machine in peer-to-peer (P2P) (or other distributed) network environment. The machine 1600 may be a personal computer (PC), a tablet PC, a set-top box (STB), a personal digital assistant (PDA), a mobile telephone, a web appliance, an IoT device, automotive system, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

Examples, as described herein, may include, or may operate by, logic, components, devices, packages, or mechanisms. Circuitry is a collection (e.g., set) of circuits implemented in tangible entities that include hardware (e.g., simple circuits, gates, logic, etc.). Circuitry membership may be flexible over time and underlying hardware variability. Circuitries include members that may, alone or in combination, perform specific tasks when operating. In an example, hardware of the circuitry may be immutably designed to carry out a specific operation (e.g., hardwired). In an example, the hardware of the circuitry may include variably connected physical components (e.g., execution units, transistors, simple circuits, etc.) including a computer-readable medium physically modified (e.g., magnetically, electrically, moveable placement of invariant massed particles, etc.) to encode instructions of the specific operation.

In connecting the physical components, the underlying electrical properties of a hardware constituent are changed, for example, from an insulator to a conductor or vice versa. The instructions enable participating hardware (e.g., the execution units or a loading mechanism) to create members of the circuitry in hardware via the variable connections to carry out portions of the specific tasks when in operation. Accordingly, the computer-readable medium is communicatively coupled to the other components of the circuitry when the device is operating. In an example, any of the physical components may be used in more than one member of more than one circuitry. For example, under operation, execution units may be used in a first circuit of a first circuitry at one point in time and reused by a second circuit in the first circuitry, or by a third circuit in a second circuitry at a different time.

The machine (e.g., computer system, a host system, etc.) 1600 may include a processing device 1602 (e.g., a hardware processor, a central processing unit (CPU), a graphics processing unit (GPU), a hardware processor core, or any combination thereof, etc.), a main memory 1604 (e.g., read-only memory (ROM), dynamic random-access memory (DRAM) such as synchronous DRAM (SDRAM) or Rambus DRAM (RDRAM), etc.), a static memory 1606 (e.g., static random-access memory (SRAM), etc.), and a storage system 1618, some or all of which may communicate with each other via a communication interface (e.g., a bus) 1630. In one example, the main memory 1604 includes one or more memory devices as described in examples above.

The processing device 1602 can represent one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. The processing device 1602 can also be one or more special-purpose processing devices such as an application specific integrated circuit (ASIC), a field programmable gate array (FPGA), a digital signal processor (DSP), network processor, or the like. The processing device 1602 can be configured to execute instructions 1626 for performing the operations and steps discussed herein. The computer system 1600 can further include a network interface device 1608 to communicate over a network 1620.

The storage system 1618 can include a machine-readable storage medium (also known as a computer-readable medium) on which is stored one or more sets of instructions 1626 or software embodying any one or more of the methodologies or functions described herein. The instructions 1626 can also reside, completely or at least partially, within the main memory 1604 or within the processing device 1602 during execution thereof by the computer system 1600, the main memory 1604 and the processing device 1602 also constituting machine-readable storage media.

The term "machine-readable storage medium" should be taken to include a single medium or multiple media that store the one or more sets of instructions, or any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media. In an example, a massed machine-readable medium comprises a machine-readable medium with multiple particles having invariant (e.g., rest) mass. Accordingly, massed machine-readable media are not transitory propagating signals. Specific examples of massed machine-readable media may include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; and CD-ROM and DVD-ROM disks.

The machine 1600 may further include a display unit, an alphanumeric input device (e.g., a keyboard), and a user interface (UI) navigation device (e.g., a mouse). In an example, one or more of the display unit, the input device, or the UI navigation device may be a touch screen display. The machine a signal generation device (e.g., a speaker), or one or more sensors, such as a global positioning system (GPS) sensor, compass, accelerometer, or one or more other sensor. The machine 1600 may include an output controller, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

The instructions 1626 (e.g., software, programs, an operating system (OS), etc.) or other data are stored on the storage system 1618 can be accessed by the main memory 1604 for use by the processing device 1602. The main memory 1604 (e.g., DRAM) is typically fast, but volatile, and thus a different type of storage than the storage system 1618 (e.g., an SSD), which is suitable for long-term storage, including while in an "off" condition. The instructions 1626 or data in use by a user or the machine 1600 are typically loaded in the main memory 1604 for use by the processing device 1602. When the main memory 1604 is full, virtual space from the storage system 1618 can be allocated to supplement the main memory 1604; however, because the storage system 1618 device is typically slower than the main memory 1604, and write speeds are typically at least twice as slow as read speeds, use of virtual memory can greatly reduce user experience due to storage system latency (in contrast to the main memory 1604, e.g., DRAM). Further, use of the storage system 1618 for virtual memory can greatly reduce the usable lifespan of the storage system 1618.

The instructions 1624 may further be transmitted or received over a network 1620 using a transmission medium via the network interface device 1608 utilizing any one of a number of transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.15 family of standards known as Wi-Fi®, IEEE 802.16 family of standards known as WiMax®), IEEE 802.15.4 family of standards, peer-to-peer (P2P) networks, among others. In an example, the network interface device 1608 may include one or more physical jacks (e.g., Ethernet, coaxial, or phone jacks) or one or more antennas to connect to the network 1620. In an example, the network interface device 1608 may include multiple antennas to wirelessly communicate using at least one of single-input multiple-output (SIMO), multiple-input multiple-output (MIMO), or multiple-input single-output (MISO) techniques. The term "transmission medium" shall be taken to include any intangible medium that is capable of storing, encoding, or carrying instructions for execution by the machine 1600, and includes digital or analog communications signals or other intangible medium to facilitate communication of such software.

The above detailed description includes references to the accompanying drawings, which form a part of the detailed description. The drawings show, by way of illustration, specific embodiments in which the invention can be practiced. These embodiments are also referred to herein as "examples". Such examples can include elements in addition to those shown or described. However, the present inventor also contemplates examples in which only those elements shown or described are provided. Moreover, the present inventor also contemplates examples using any combination or permutation of those elements shown or described (or one or more aspects thereof), either with respect to a particular example (or one or more aspects thereof), or with respect to other examples (or one or more aspects thereof) shown or described herein.

All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein". Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

In various examples, the components, controllers, processors, units, engines, or tables described herein can include, among other things, physical circuitry or firmware stored on a physical device. As used herein, "processor" means any type of computational circuit such as, but not limited to, a microprocessor, a microcontroller, a graphics processor, a digital signal processor (DSP), or any other type of processor or processing circuit, including a group of processors or multi-core devices.

The term "horizontal" as used in this document is defined as a plane parallel to the conventional plane or surface of a substrate, such as that underlying a wafer or die, regardless of the actual orientation of the substrate at any point in time. The term "vertical" refers to a direction perpendicular to the horizontal as defined above. Prepositions, such as "on," "over," and "under" are defined with respect to the conventional plane or surface being on the top or exposed surface of the substrate, regardless of the orientation of the substrate; and while "on" is intended to suggest a direct contact of one structure relative to another structure which it lies "on" (in the absence of an express indication to the contrary); the terms "over" and "under" are expressly intended to identify a relative placement of structures (or layers, features, etc.), which expressly includes—but is not limited to—direct contact between the identified structures unless specifically identified as such. Similarly, the terms "over" and "under" are not limited to horizontal orientations, as a structure may be "over" a referenced structure if it is, at some point in time, an outermost portion of the construction under discussion, even if such structure extends vertically relative to the referenced structure, rather than in a horizontal orientation.

The terms "wafer" and "substrate" are used herein to refer generally to any structure on which integrated circuits are formed, and also to such structures during various stages of integrated circuit fabrication. The following detailed description is, therefore, not to be taken in a limiting sense, and the scope of the various embodiments is defined only by the appended claims, along with the full scope of equivalents to which such claims are entitled.

Various embodiments according to the present disclosure and described herein include memory utilizing a vertical structure of memory cells (e.g., NAND strings of memory cells). As used herein, directional adjectives will be taken relative a surface of a substrate upon which the memory cells are formed (i.e., a vertical structure will be taken as extending away from the substrate surface, a bottom end of the vertical structure will be taken as the end nearest the substrate surface and a top end of the vertical structure will be taken as the end farthest from the substrate surface).

As used herein, directional adjectives, such as horizontal, vertical, normal, parallel, perpendicular, etc., can refer to relative orientations, and are not intended to require strict adherence to specific geometric properties, unless otherwise noted. For example, as used herein, a vertical structure need not be strictly perpendicular to a surface of a substrate, but may instead be generally perpendicular to the surface of the substrate, and may form an acute angle with the surface of the substrate (e.g., between 60 and 120 degrees, etc.).

In some embodiments described herein, different doping configurations may be applied to a select gate source (SGS), a control gate (CG), and a select gate drain (SGD), each of which, in this example, may be formed of or at least include polysilicon, with the result such that these tiers (e.g., polysilicon, etc.) may have different etch rates when exposed to an etching solution. For example, in a process of forming a monolithic pillar in a 3D semiconductor device, the SGS and the CG may form recesses, while the SGD may remain less recessed or even not recessed. These doping configurations may thus enable selective etching into the distinct tiers (e.g., SGS, CG, and SGD) in the 3D semiconductor device by using an etching solution (e.g., tetramethylammonium hydroxide (TMCH)).

Operating a memory cell, as used herein, includes reading from, writing to, or erasing the memory cell. The operation of placing a memory cell in an intended state is referred to herein as "programming," and can include both writing to or erasing from the memory cell (i.e., the memory cell may be programmed to an erased state).

According to one or more embodiments of the present disclosure, a memory controller (e.g., a processor, controller, firmware, etc.) located internal or external to a memory device, is capable of determining (e.g., selecting, setting, adjusting, computing, changing, clearing, communicating, adapting, deriving, defining, utilizing, modifying, applying, etc.) a quantity of wear cycles, or a wear state (e.g., recording wear cycles, counting operations of the memory device as they occur, tracking the operations of the memory device it initiates, evaluating the memory device characteristics corresponding to a wear state, etc.)

According to one or more embodiments of the present disclosure, a memory access device may be configured to provide wear cycle information to the memory device with each memory operation. The memory device control circuitry (e.g., control logic) may be programmed to compensate for memory device performance changes corresponding to the wear cycle information. The memory device may receive the wear cycle information and determine one or more operating parameters (e.g., a value, characteristic) in response to the wear cycle information.

It will be understood that when an element is referred to as being "on," "connected to" or "coupled with" another element, it can be directly on, connected, or coupled with the other element or intervening elements may be present. In contrast, when an element is referred to as being "directly on," "directly connected to" or "directly coupled with" another element, there are no intervening elements or layers present. If two elements are shown in the drawings with a line connecting them, the two elements can be either be coupled, or directly coupled, unless otherwise indicated.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer-readable instructions for performing various methods. The code may form portions of computer program products. Further, the code can be tangibly stored on one or more volatile or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMS), read only memories (ROMs), and the like.

To better illustrate the method and apparatuses disclosed herein, a non-limiting list of embodiments is provided here:

In a first example, Example 1, a memory module can include: a first stack of at least eight memory die including four pairs of memory die, each pair of the four pairs of memory die associated with an individual memory rank of four memory ranks of the memory module; a memory controller configured to receive memory access commands and to access memory locations of the first stack; and a substrate configured to route connections between external terminations of the memory module and the memory controller.

In Example 2, the subject matter of Example 1 includes, wherein the first stack includes at least nine memory dies; wherein the controller is configured to store error correction code (ECC) information on a first memory die of the at least nine memory dies; and wherein the first memory die is not one of the four pairs of memory dies.

In Example 3, the subject matter of Example 2 includes, wherein the first stack includes at least ten memory dies; wherein the controller is configured to store single device data correction (SDDC) information on a second memory die of the at least ten memory dies; and wherein the second memory die is not one of the four pairs of memory dies.

In Example 4, the subject matter of Examples 1-3 includes, wherein the memory controller is mounted laterally offset from the first stack on the substrate.

In Example 5, the subject matter of Examples 1-4 includes, wherein the memory controller is mounted between the first stack and the substrate.

In Example 6, the subject matter of Examples 1-5 includes, a plurality of wire bond terminations configured to couple terminations of the first stack with terminations of the substrate.

In Example 7, the subject matter of Example 6 includes, wherein a first wire bond termination of the plurality of wire bond terminations is configured to couple a first, single, data termination of the substrate with a first data termination of at least four memory die of the first stack of eight memory dies.

In Example 8, the subject matter of Examples 1-7 includes, a second stack of at least eight memory dies, the second stack including a second four pairs of memory dies, each pair of the second four pairs of memory dies associated with an individual memory rank of the four memory ranks of the memory module.

In Example 9, the subject matter of Example 8 includes, wherein the second stack is offset on the substrate from the first stack and from the memory controller.

In Example 10, the subject matter of Examples 8-9 includes, wherein the second stack is stacked with the first stack.

In Example 11, the subject matter of Examples 8-10 includes, wherein each rank includes at least four memory die of the memory dies forming the first stack and forming the second stack.

In Example 12, the subject matter of Examples 1-11 includes, wherein each memory die of the at least eight memory dies in the first stack is offset laterally from a neighboring memory die of the first stack to expose a wire bond termination area of at least seven of the at least eight memory dies.

In Example 13, the subject matter of Examples 1-12 includes, a buffer die coupled to a substrate, the buffer die including a host device interface, and a memory interface coupled to the first stack; and circuitry in the buffer die, configured to operate the host interface at a first data speed, and to operate the memory interface at a second data speed, slower than the first data speed.

In Example 14, the subject matter of Example 13 includes, wherein the first stack includes dynamic random-access memory (DRAM) die.

In Example 15, the subject matter of Examples 13-14 includes, eight dynamic random-access memory (DRAM) die.

In Example 16, the subject matter of Examples 13-15 includes, nine dynamic random-access memory (DRAM) die.

In Example 17, the subject matter of Examples 13-16 includes, ten dynamic random-access memory (DRAM) die.

In Example 18, the subject matter of Examples 13-17 includes, sixteen dynamic random-access memory (DRAM) die.

In Example 19, the subject matter of Examples 13-18 includes, eighteen dynamic random-access memory (DRAM) die.

In Example 20, the subject matter of Examples 13-19 includes, twenty dynamic random-access memory (DRAM) die.

In Example 21, the subject matter of Examples 1-20 includes, wherein the first stack includes stair-stepped stacked memory dies.

In Example 22, the subject matter of Example 21 includes, wherein the first stack includes more than one step direction within a single stack.

Example 23 is a method comprising: storing information at memory cells of a stack of at least eight memory devices; and organizing the information across four ranks of memory cells, wherein each rank of the four ranks is assigned to at least two of the at least eight memory devices.

In Example 24, the subject matter of Example 23 includes, storing error correction code (ECC) information on memory cells of a ninth memory device of the stack, wherein the ninth memory device is in addition to the at least eight memory devices.

In Example 25, the subject matter of Example 24 includes, wherein the ninth memory device is assigned the ECC information for a single rank of the four ranks.

In Example 26, the subject matter of Examples 24-25 includes, storing Single Device Data Correction (SDDC) information on memory cells of a tenth memory device of the stack, wherein the tenth memory device is in addition to the at least eight memory devices.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. A memory assembly, comprising:
a first stack of DRAM memory die including four pairs of DRAM memory die, each pair of the four pairs of DRAM memory die associated with an individual memory rank of four memory ranks, the first stack further including an additional DRAM memory die coupled to store ECC data associated with at least one of the four memory ranks; and
a buffer including,
a host device interface having host DQs operating at a first data rate, the host DQs including ECC DQs, and multiple DRAM device interfaces coupled to DRAM memory die of the first stack, the DRAM device interfaces having memory DQs operating at a second data rate slower than the first data rate;
wherein individual host device interface DQs are coupled through the buffer to respective multiple memory DQs of the multiple DRAM data interfaces, the respective memory DQs extending to multiple memory slices, wherein each memory slice extends across multiple memory ranks.

2. The memory assembly of claim 1, wherein each DRAM device interface is coupled to at least one respective DRAM memory die of the first stack of DRAM memory die through a wire bond connection.

3. The memory assembly of claim 2, wherein the first stack of DRAM memory die and the buffer are supported on a substrate, and wherein the substrate comprises electrical conductors establishing electrical connections between a respective DRAM device interface of the buffer and a respective wire bond connection to at least one respective DRAM memory die.

4. The memory assembly of claim 1, wherein host interface includes sufficient ECC DQs to enable single device data correction (SDDC), and wherein the first stack of DRAM memory die further comprises a further DRAM memory die coupled to store ECC data associated with at least one rank of the DRAM memory die.

5. The memory assembly of claim 4, wherein the additional DRAM memory die and the further DRAM memory die are coupled to store ECC data for at least two ranks of the four ranks of DRAM memory.

6. The memory assembly of claim 1, wherein individual host device interface DQs are coupled to at least four memory DQs, wherein individual memory DQs carry only data of a single memory rank.

7. A memory assembly, comprising:
at least four ranks of memory, each rank extending across at least four respective DRAM memory die; and
a buffer, including,
a host device interface having a first number of host DQs operating at a first data rate, and
multiple DRAM device interfaces coupled to DRAM memory die, the DRAM device interfaces having a second number of memory DQs operating at a second data rate slower than the first data rate, wherein the second number of memory DQs is a multiple of the first number of host DQs;
wherein individual host device interface DQs are coupled through the buffer to multiple memory DQs of the DRAM device interfaces, the respective memory DQs extending to multiple memory slices, wherein each memory slice extends across multiple ranks of memory die.

8. The memory assembly of claim 7 wherein each data slice extends across at least four ranks of memory.

9. The memory assembly of claim 7, wherein the host device interface further includes ECC DQs operating at the first data rate; and
wherein the memory assembly further comprises at least two additional DRAM memory die, and wherein the multiple DRAM device interfaces further include ECC memory DQs operating at the second data rate and extending to at least one of the two additional DRAM memory die.

10. The memory assembly of claim 9, wherein ECC memory DQs associated with two ranks of memory are coupled to respective planes of one of the at least two additional memory die.

11. The memory assembly of claim 9, wherein the ECC memory DQs associated with the at least four ranks of memory are coupled to respective planes in the at least two additional DRAM memory die.

12. The memory assembly of claim 7, wherein each memory slice extends across all four ranks of memory.

13. The memory assembly of claim 7, wherein the first number of host DQs represents a single data channel width of an industry-standard memory interface.

14. The memory assembly of claim 9, wherein the host device interface ECC DQs provides both ECC and single device data correction (SDDC) for the multiple ranks of memory.

15. The memory assembly of claim 7, wherein the at least four ranks of memory, each rank extending across at least four respective DRAM memory die comprises at least 16 DRAM memory dies of the at least four ranks of memory, which are stacked above the buffer.

16. The memory assembly of claim 7, wherein the memory assembly includes at least two stacks of at least eight DRAM memory dies each, wherein at least four memory die of four respective ranks are interconnected with one another through wire bonds.

17. The memory assembly of claim 7, wherein the memory assembly includes at least one stack of at least 16 DRAM memory dies, wherein at least four DRAM memory dies of each of the at least four respective ranks are respectively interconnected with one another through wire bonds.

18. The memory assembly of claim 9, wherein at least two additional DRAM memory dies are stacked with the at least sixteen DRAM memory dies of the at least four ranks of memory, each rank extending across at least four DRAM memory die; and wherein the at least two additional DRAM memory dies are coupled to ECC memory DQs of the multiple DRAM interfaces.

19. The memory assembly of claim 16, wherein individual DRAM memory dies in each of the at least two stacks of at least eight DRAM memory dies are laterally offset from a vertically adjacent die in a stairstep configuration.

20. The memory assembly of claim 18, wherein individual DRAM memory dies in the at least one stack of at least 16 DRAM memory dies and at least two additional DRAM memory dies are laterally offset from a vertically adjacent die in a stairstep configuration with wirebonds extending between selected die within the stack.

\* \* \* \* \*